United States Patent
Zheng et al.

(10) Patent No.: US 10,381,356 B2
(45) Date of Patent: Aug. 13, 2019

(54) LOW POWER EMBEDDED ONE-TIME PROGRAMMABLE (OTP) STRUCTURES

(71) Applicant: GLOBALFOUNDRIES Singapore Pte. Ltd., Singapore (SG)

(72) Inventors: Ping Zheng, Singapore (SG); Eng Huat Toh, Singapore (SG); Kiok Boone Elgin Quek, Singapore (SG); Yuan Sun, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/674,558

(22) Filed: Aug. 11, 2017

(65) Prior Publication Data

US 2017/0345830 A1    Nov. 30, 2017

Related U.S. Application Data

(62) Division of application No. 14/884,747, filed on Oct. 15, 2015, now Pat. No. 9,735,164.

(51) Int. Cl.
| | | |
|---|---|---|
| *H01L 27/112* | (2006.01) | |
| *H01L 29/423* | (2006.01) | |
| *H01L 29/06* | (2006.01) | |
| *H01L 29/66* | (2006.01) | |

(Continued)

(52) U.S. Cl.
CPC .... *H01L 27/11206* (2013.01); *H01L 29/0673* (2013.01); *H01L 29/42392* (2013.01);
(Continued)

(58) Field of Classification Search
CPC ......... H01L 27/11206; H01L 29/66439; H01L 29/775; H01L 29/0673; H01L 29/42392;
(Continued)

(56) References Cited

U.S. PATENT DOCUMENTS 7,569,489 B2 *  8/2009  Dyer ............... H01L 21/823807
                                              257/E21.632
7,915,693 B2    3/2011  Okano
(Continued)

OTHER PUBLICATIONS

Y.Liu et al., Anti-Fuse Memory Array Embedded in 14nm FinFET CMOS with Novel Selector-Less Bit-Cell Featuring Self-Rectifying Characteristics, 2014 Symposium on VLSI Technology Digest of Technical Papers, 2014, IEEE, Malta, NY, USA.
(Continued)

*Primary Examiner* — David Vu
(74) *Attorney, Agent, or Firm* — Thompson Hine LLP

(57) ABSTRACT

Devices and methods for forming a device are presented. The method includes providing a substrate prepared with at least a first region for accommodating an anti-fuse based memory cell. A fin structure is formed in the first region. The fin structure includes top and bottom fin portions and includes channel and non-channel regions defined along the length of the fin structure. An isolation layer is formed on the substrate. The isolation layer has a top isolation surface disposed below a top fin surface, leaving the top fin portion exposed. At least a portion of the exposed top fin portion in the channel region is processed to form a sharpened tip profile at top of the fin. A gate having a gate dielectric and a metal gate electrode is formed over the substrate. The gate wraps around the channel region of the fin structure.

9 Claims, 32 Drawing Sheets

(51) Int. Cl.
*H01L 29/775* (2006.01)
*H01L 29/78* (2006.01)
*B82Y 40/00* (2011.01)
*B82Y 10/00* (2011.01)
*H01L 23/525* (2006.01)

(52) U.S. Cl.
CPC .. *H01L 29/66439* (2013.01); *H01L 29/66545* (2013.01); *H01L 29/775* (2013.01); *H01L 29/7851* (2013.01); *B82Y 10/00* (2013.01); *B82Y 40/00* (2013.01); *H01L 23/5252* (2013.01); *Y10S 977/765* (2013.01); *Y10S 977/888* (2013.01); *Y10S 977/943* (2013.01)

(58) Field of Classification Search
CPC ......... H01L 29/78696; H01L 29/66545; H01L 23/5252; B82Y 40/00; B82Y 10/00; Y10S 977/943; Y10S 977/765; Y10S 977/888
See application file for complete search history.

(56) References Cited

U.S. PATENT DOCUMENTS

| | | | |
|---|---|---|---|
| 8,841,701 B2 * | 9/2014 | Lin | H01L 29/7853 257/192 |
| 9,054,189 B1 * | 6/2015 | Kim | H01L 29/7848 |
| 2007/0004123 A1 | 1/2007 | Bohr et al. | |
| 2013/0187228 A1 | 7/2013 | Xie et al. | |
| 2014/0001562 A1 | 1/2014 | Liaw | |

OTHER PUBLICATIONS

Kian Hui Goh et al., Selective Growth of Gallium Arsenide on Germanium Fins with Different Orientations Formed on 10° C. Offcut Germanium-on-Insulator Substrate, Sep. 25-27, 2012, pp. 1063-1064, International Conference on Solid-State Devices and Materials, Kyoto, Japan.

M.A.R. Alves et al., Fabrication of Sharp Silicon Tips Employing Anisotropic Wet Etching and Reactive Ion Etching, Microelectronics Journal, 2005, pp. 51-54, 36, Elsevier Ltd., Brazil.

M. Togo et al., Phosphorus Doped SiC Source Drain and SiGe Channel for Scaled Bulk FinFETs, Electron Devices Meeting (IEDM), 2012, IEEE International, San Francisco, CA, USA.

M. Najmzadeh et al., Accumulation-Mode Gate-All-Around Si Nanowire nMOSFETs with Sub-5 nm Cross-Section and High Uniaxial Tensile Strain, 2012, pp. 114-120, 74, Elsevier Ltd., Switzerland.

* cited by examiner

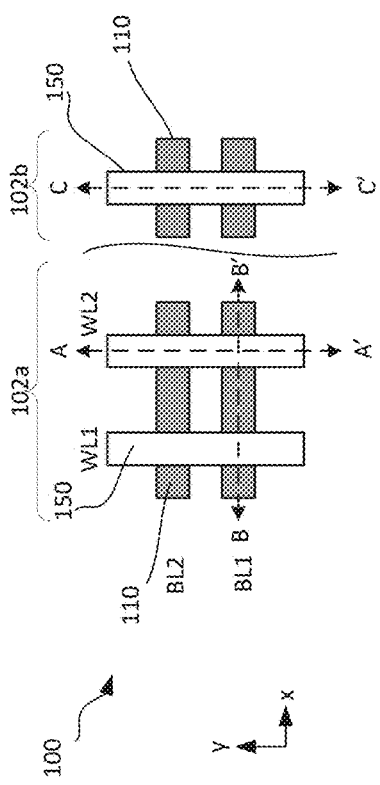
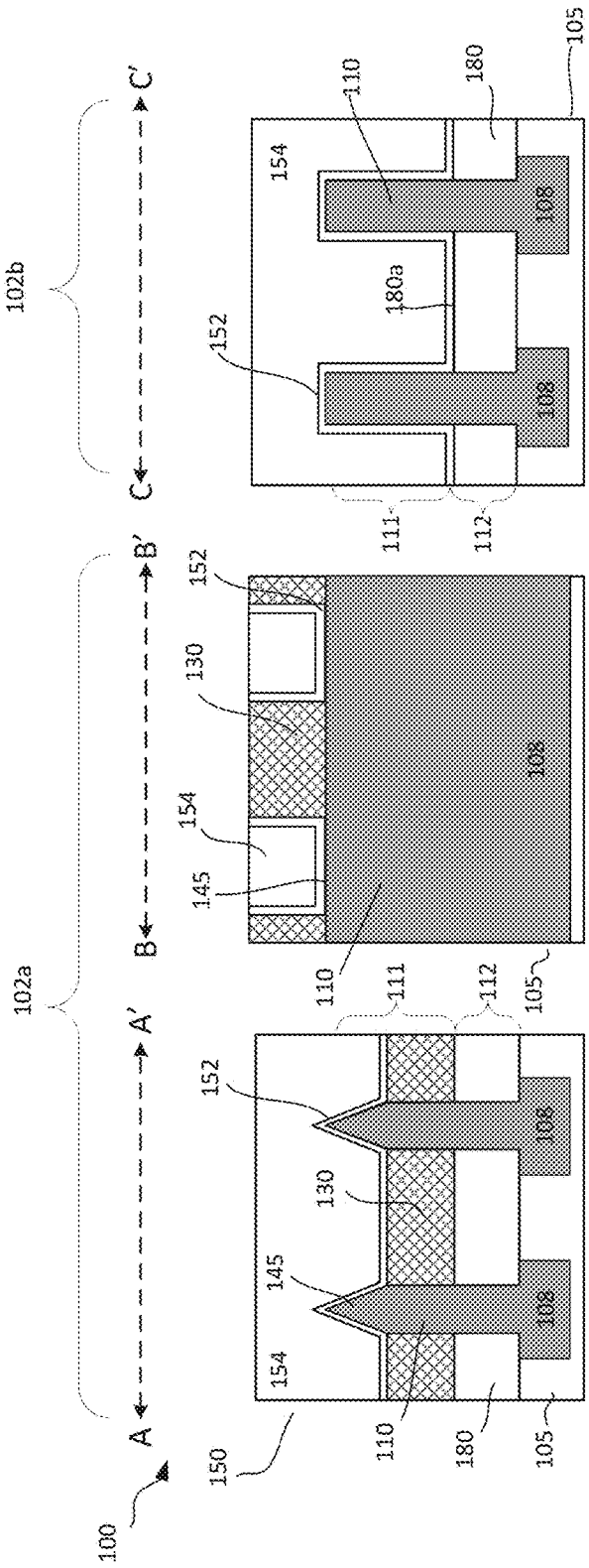
Fig. 1a
Fig. 1b
Fig. 1c
Fig. 1d

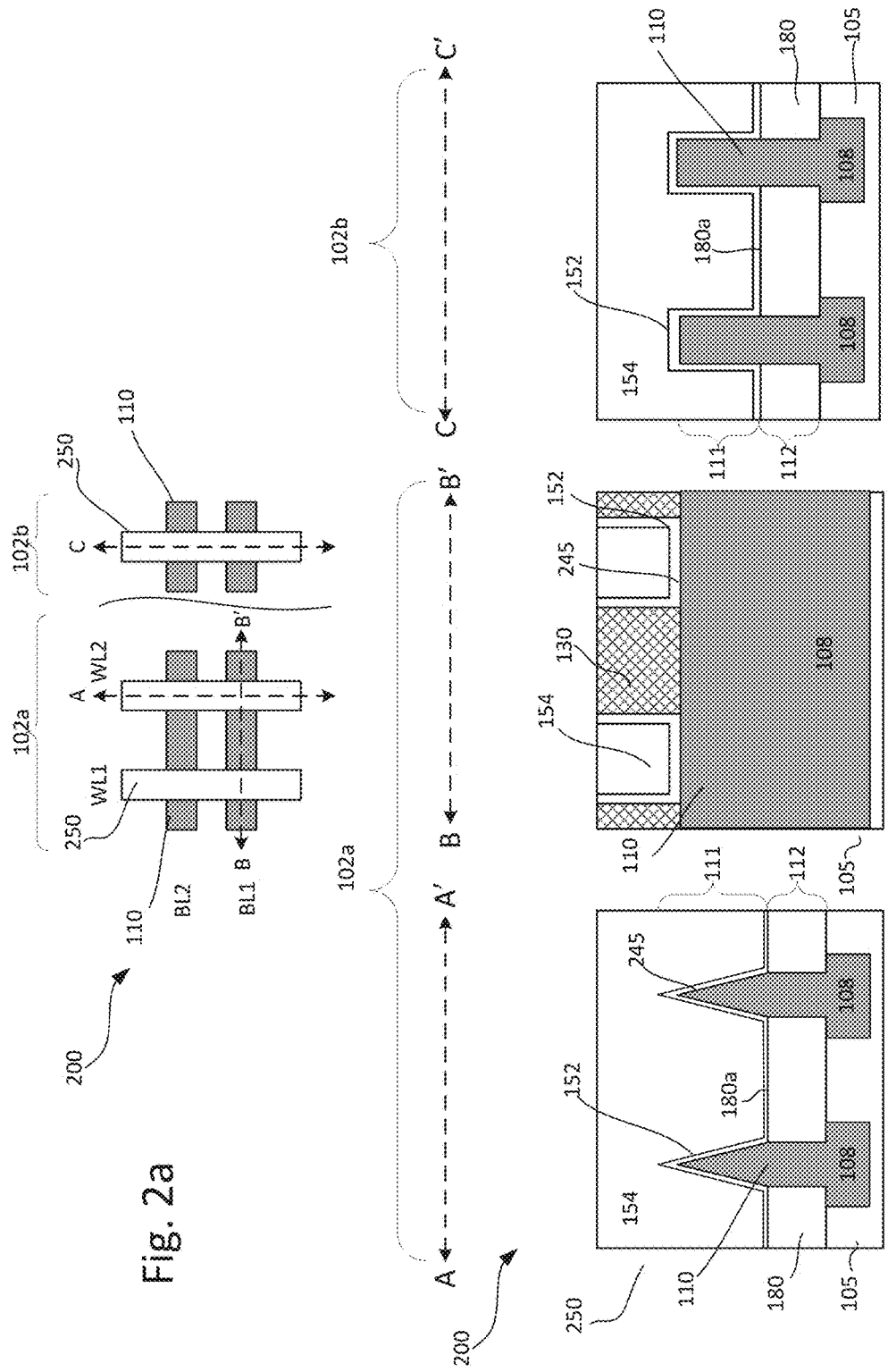

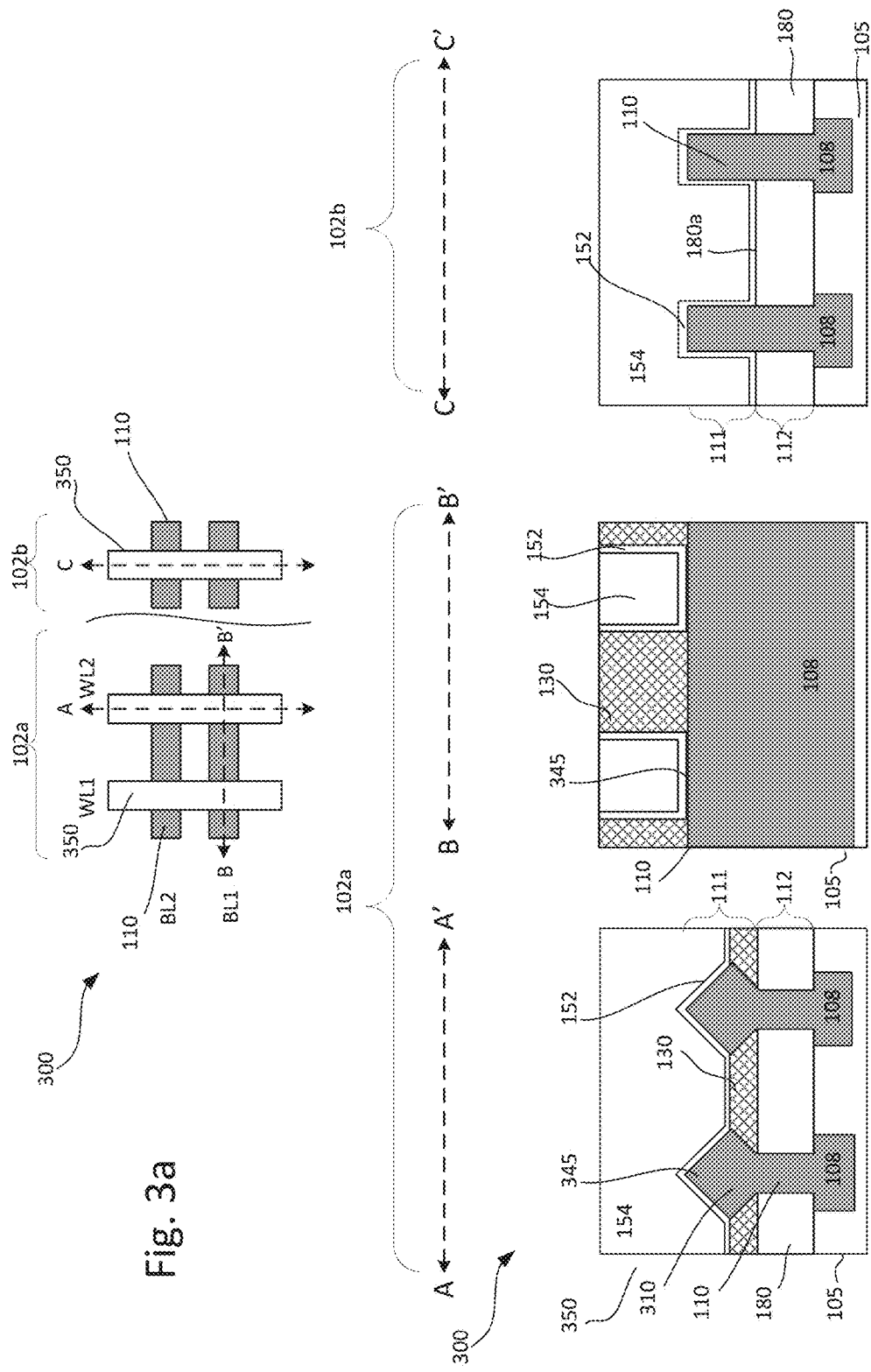

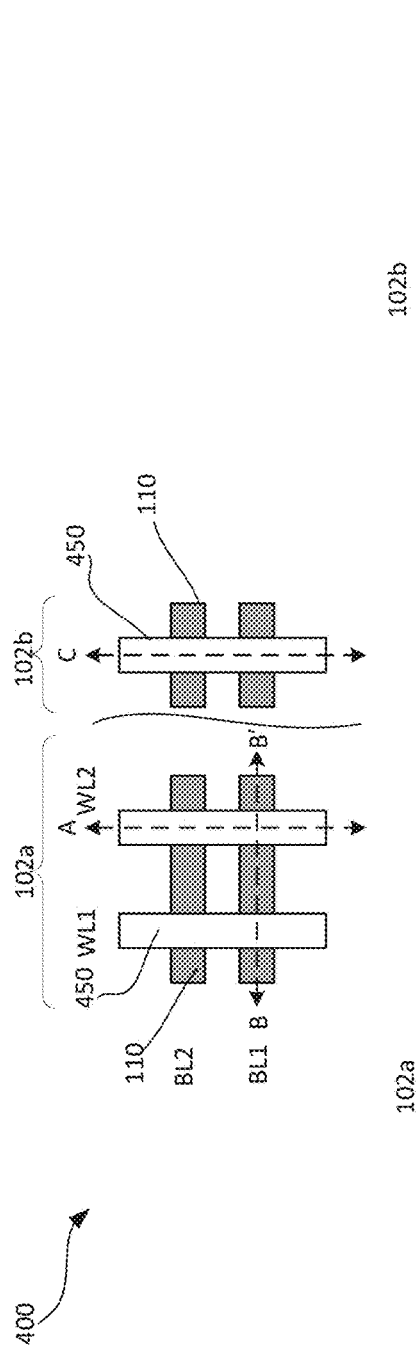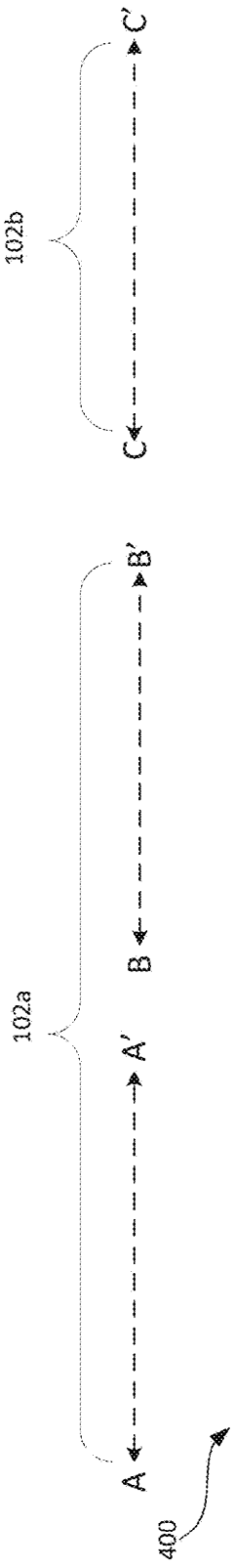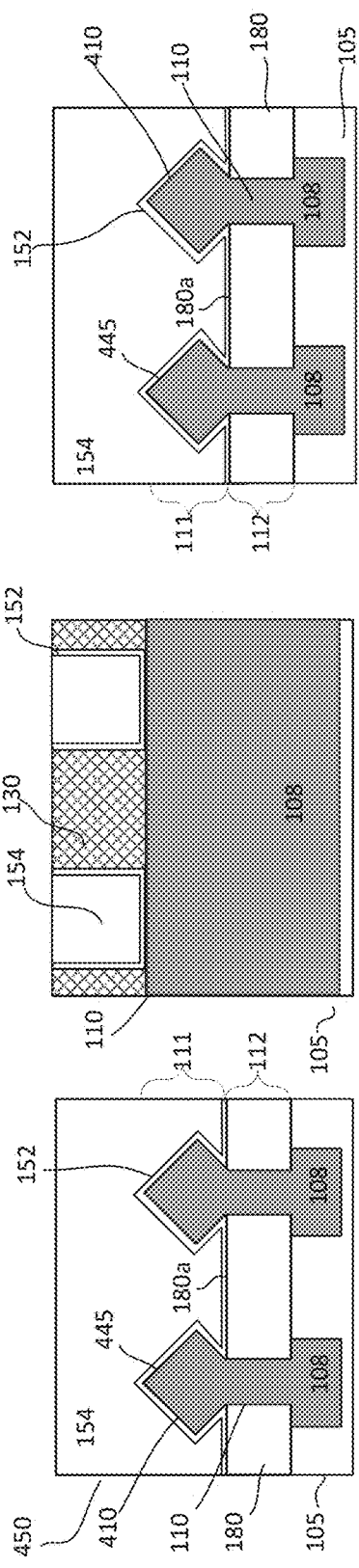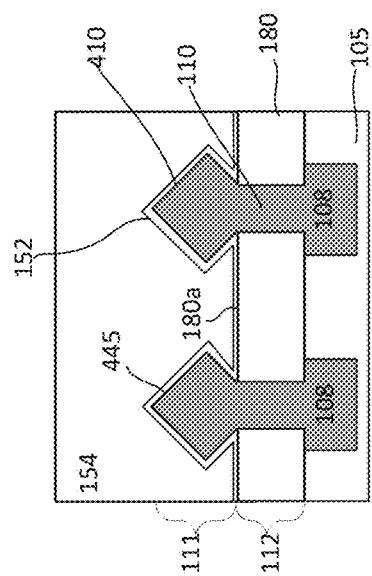

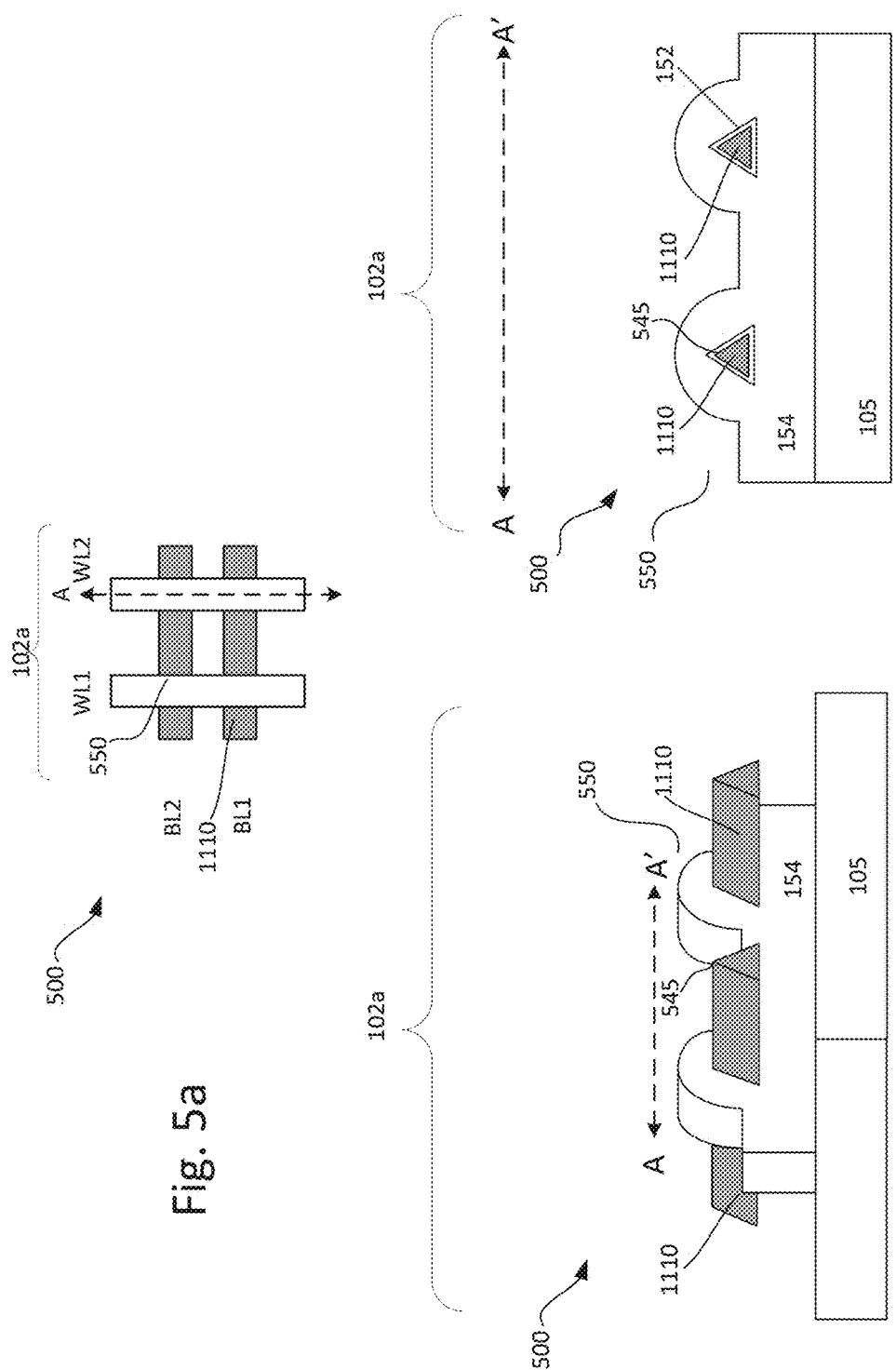

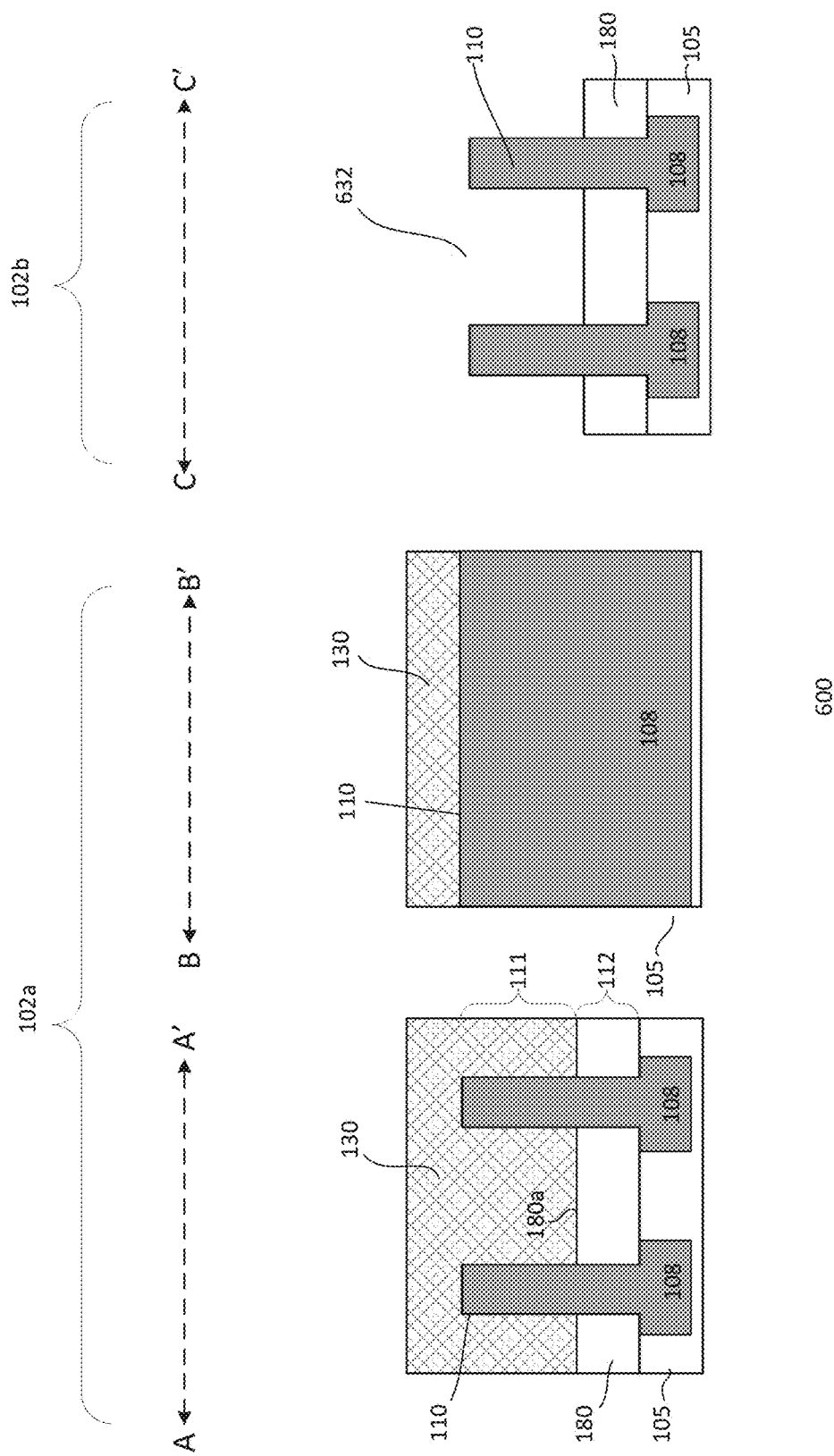

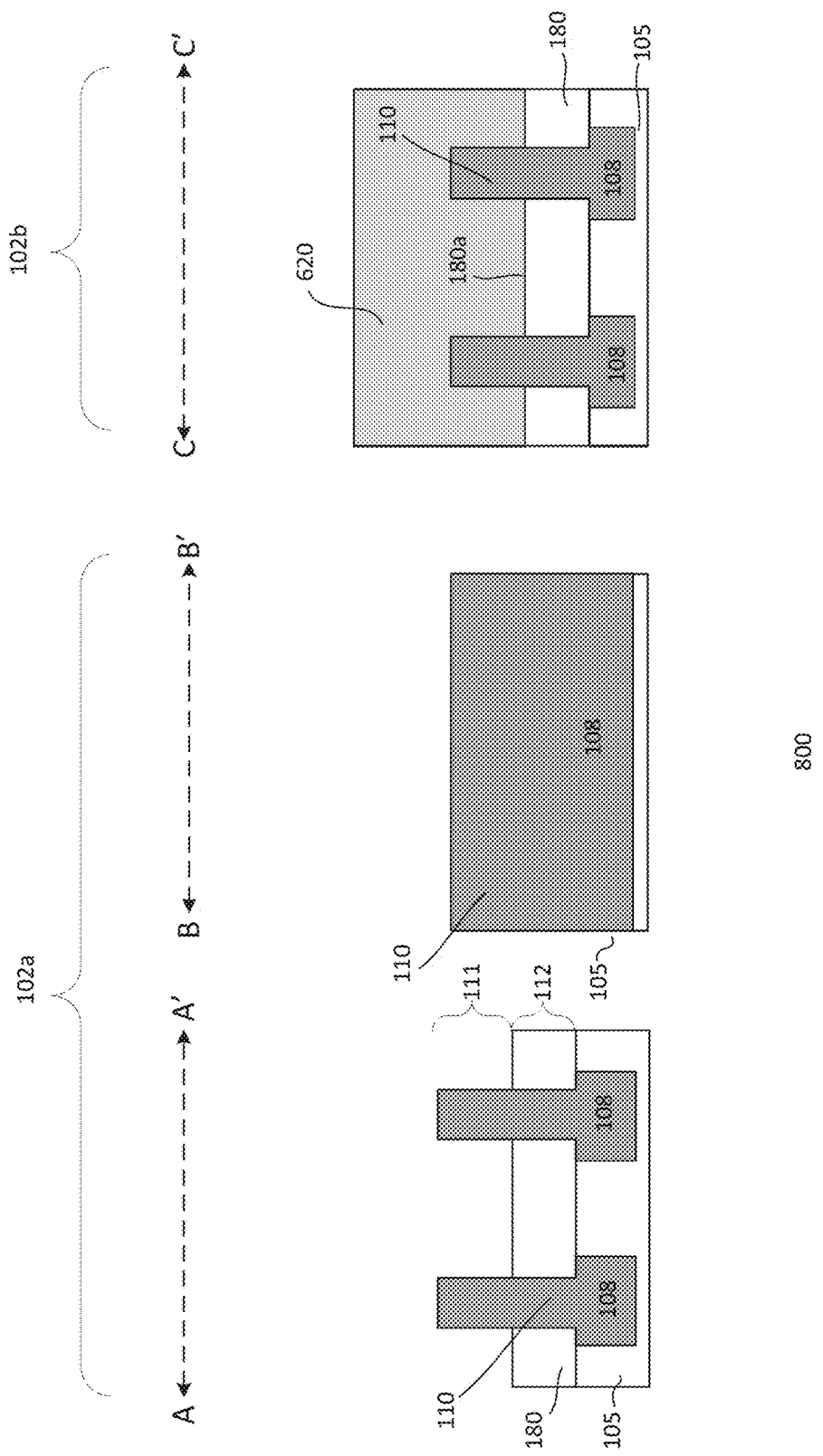

LOW POWER EMBEDDED ONE-TIME PROGRAMMABLE (OTP) STRUCTURES

CROSS-REFERENCE TO RELATED APPLICATION

This application is a divisional application which claims benefit of copending U.S. patent application Ser. No. 14/884,747, filed on Oct. 15, 2015, which is herein incorporated by reference in its entirety for all purposes.

BACKGROUND

Consumer electronic product manufacturers are under heavy pressure to reduce costs, increase performance, minimize power consumption, and increase security. Configurability and programmability can help in achieving these goals. One-time programmable (OTP) memory is one approach that enables configurability and programmability. However, current embedded anti-fuse based OTP structure in fin field effect transistor (finFET) process requires high programming voltage. This may lead to high power consumption as well as power supply incompatibility with logic devices which are not desirable.

Therefore, there is a need to provide an OTP memory device that is area efficient, requires lower power and has high performance as well as improved compatibility of power supply with logic device. It is also desired to provide simplified and cost effective methods of forming these devices.

SUMMARY

Embodiments generally relate to semiconductor devices and methods for forming a semiconductor device. In one aspect, a method for forming a device is disclosed. The method includes providing a substrate prepared with at least a first region for accommodating an anti-fuse based memory cell. A fin structure is formed in the first region. The fin structure includes top and bottom fin portions and includes channel and non-channel regions defined along the length of the fin structure. An isolation layer is formed on the substrate. The isolation layer has a top isolation surface disposed below a top fin surface, leaving the top fin portion exposed. At least a portion of the exposed top fin portion in the channel region is processed to form a sharpened tip profile at top of the fin. A gate having a gate dielectric and a metal gate electrode is formed over the substrate. The gate wraps around the channel region of the fin structure.

In another aspect, a method for forming a device is presented. The method includes providing a substrate prepared with at least a first region for accommodating an anti-fuse based memory cell and a second region for accommodating a logic transistor. Fin structures are formed in the first and second regions. A fin structure includes top and bottom fin portions and includes channel and non-channel regions defined along the length of the fin structure. An isolation layer is formed on the substrate. The isolation layer has a top isolation surface disposed below a top fin surface, leaving the top fin portion of the fin structures exposed. At least a portion of the exposed top fin portion in the channel region of the fin structure in the first region is processed to form a sharpened tip profile at top of the fin. Gates having a gate dielectric and a metal gate electrode are formed over the substrate in the first and second regions. A gate wraps around the channel region of the fin structure.

In yet another aspect, a device is disclosed. The device includes a substrate having at least a first region for accommodating an anti-fuse based memory cell. A fin structure is disposed in the first region. The fin structure includes top and bottom fin portions and includes channel and non-channel regions defined along the length of the fin structure. An isolation layer is disposed on the substrate. The isolation layer has a top isolation surface disposed below a top fin surface, leaving the top fin portion exposed. At least a portion of the exposed top fin portion in the channel region includes a sharpened tip profile at top of the fin. A gate having a gate dielectric and a metal gate electrode is disposed over the substrate. The gate wraps around the channel region of the fin structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 1a-1d show various views of an embodiment of a device;

FIGS. 2a-2d show various views of another embodiment of a device;

FIGS. 3a-3d show various views of another embodiment of a device;

FIGS. 4a-4d show various views of yet another embodiment of a device;

FIGS. 5a-5c show various views of another embodiment of a device;

FIGS. 6a-6h show cross-sectional views of an embodiment of a process for forming a device;

FIGS. 8a-8f show cross-sectional views of another embodiment of a process for forming a device;

DETAILED DESCRIPTION

Figure 6A:
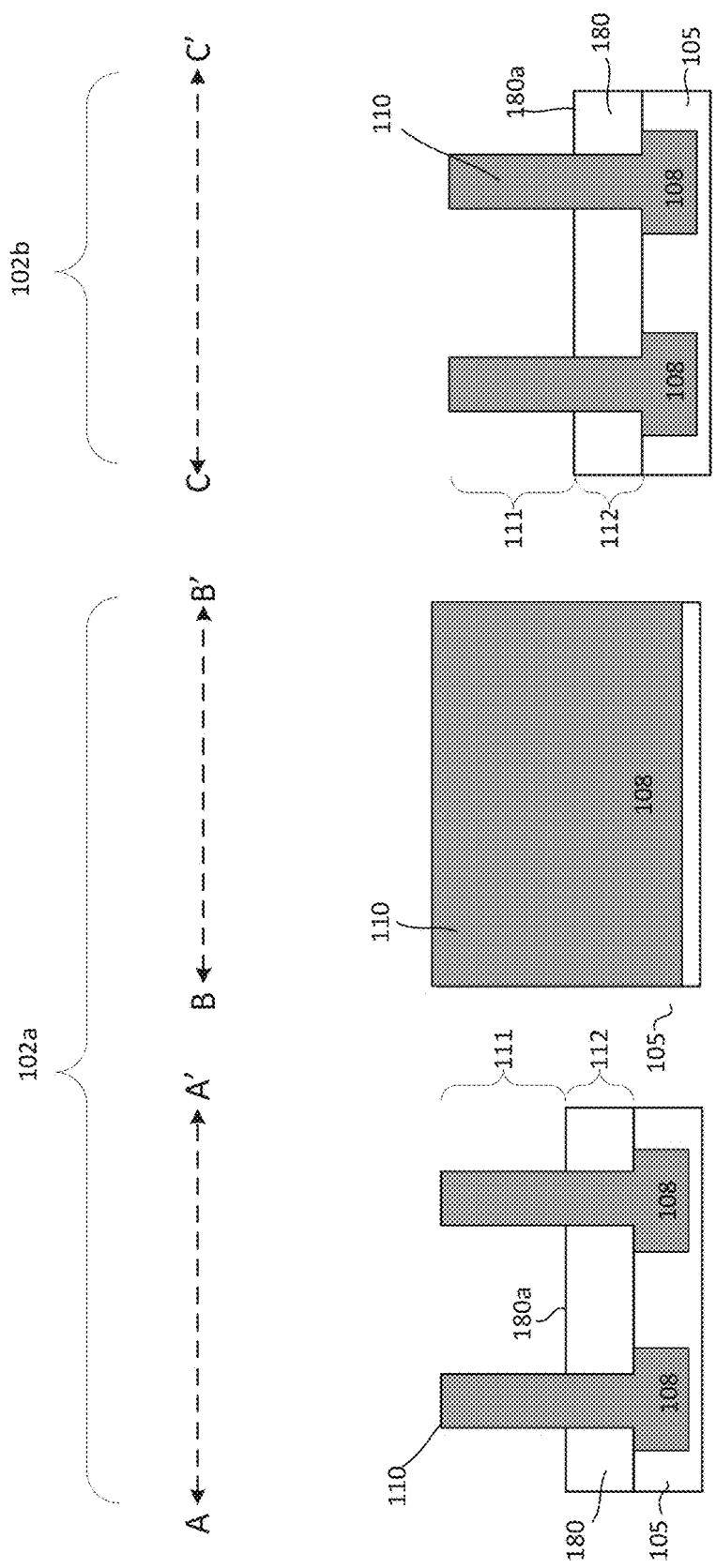

Embodiments generally relate to semiconductor devices. More particularly, some embodiments relate to memory devices, such as non-volatile memory (NVM) devices. The NVM devices, in one embodiment, are anti-fuse based one-time programmable (OTP) memory devices. The anti-fuse based OTP memory as will be described herein includes a gate electrode that overlies a fin structure or nanowire, with a gate dielectric configured to provide an anti-fuse unit cell and disposed between the fin structure or nanowire and the gate electrode. The anti-fuse based OTP memory as will be described herein is programmable by applying an electrical stress that creates a low resistance conductive path, such as a short. Such a short may be achieved by the breakdown of the gate dielectric. The fin structure or the nanowire of the present disclosure includes a sharpened tip profile which enhances electric field when voltage is applied between the gate electrode and substrate. The high electric field at the sharpened tip allows for controlling of the rupture of the gate dielectric during programming of the OTP memory. The sharpened tip profile of the fin structure and nanowire reduces the required programming voltage for the OTP memory cell, leading to lower power consumption. Such memory devices, for example, can be incorporated into standalone devices or system on chips. The devices or ICs can be incorporated into or used with, for example, consumer electronic products, or relate to other types of devices.

FIGS. 1a-1d show various views of an embodiment of a device 100. FIG. 1a shows a simplified top view of a cross-point memory array in a first region 102a and top view of logic components in a second region 102b while FIGS. 1b-1d show corresponding cross-sectional views. FIG. 1b shows a cross-sectional view of the first region 102a of the device taken along A-A' and FIG. 1c shows a cross-sectional view of the first region taken along B-B'. As for FIG. 1d, it shows a cross-sectional view of the second region 102b of the device taken along C-C'. The first region 102a is a memory or array region having a plurality of memory cells. In one embodiment, the memory cells are anti-fuse based OTP memory cells. As for the second region 102b, it is a logic region having one or more logic transistors. Although two regions are shown, it is understood that other suitable number and types of device regions (not shown) may be included in the device.

Referring to FIGS. 1a-1d, the device includes a substrate 105. The substrate may be a silicon substrate. The substrate may be lightly doped with, for example, p-type dopants. Providing other suitable types of substrates, including SiGe, Ge and group III-V semiconductors such as GaAs, InP and InAs, including substrates doped with other types of dopants or undoped substrates, are also useful. Other suitable types of substrate, such as crystalline-on-insulator which includes silicon-on-insulator (SOI) type of substrate, may also be useful.

As shown, the substrate 105 is prepared with at least a first region 102a for accommodating a plurality of anti-fuse based memory cells and second region 102b for accommodating a plurality of logic transistors. The substrate may also include other device regions (not shown) for accommodating other types of devices. The memory cells and logic transistors, in one embodiment, are fin-type based devices. The substrate, as shown, includes a plurality of fin structures 110 disposed in the first and second regions. An isolation layer 180 is disposed on a surface of the substrate to isolate the device regions and the fin structures from each other. The isolation layer includes a dielectric material, such as a silicon oxide. Other suitable types of dielectric material may also be useful. The isolation layer, for example, has a height or thickness sufficient to provide isolation from the substrate below and between adjacent fin structures. The thickness of the isolation layer, for example, may be about 100-500 nm. Other suitable thickness ranges may also be useful.

The fin structure 110, for example, extends from the top surface of the substrate to above and beyond the top surface 180a of the isolation layer 180. The fin structure, for example, is an elongated member disposed along a first direction (e.g., x-direction). The fin structure has sufficient length to include a body or channel region (e.g., region over which a metal gate will be disposed thereon) and non-channel regions (e.g., contact regions of the memory cell or logic transistor). The height of the fin structure should be sufficient to provide top and bottom fin portions which serve as a body of the transistor. The height of the fin, for example, may be about 40-50 nm. As for the width, it may be about 5-30 nm. Other suitable fin dimensions may also be useful. As shown, the fin structure has a top fin portion 111 which protrudes beyond the top surface 180a of the isolation layer and a bottom fin portion 112 which is embedded within the isolation layer. Doped wells 108, such as n-type doped wells, may be disposed in the substrate under the fin structures in the first and second regions. The doped wells in the first region serve as bitlines (BL) for the OTP memory cell. The doped wells which serve as bitlines are separated from each other by material of the substrate 105 disposed in between the adjacent bitlines.

A dielectric layer 130 is disposed on the substrate in the first region 102a and second region 102b (not shown in FIG. 1d). The dielectric layer, for example, serves as a pre-metal dielectric (PMD) layer. The dielectric layer, for example, includes a silicon oxide layer. Other suitable types of dielectric layer may also be useful.

In one embodiment, at least a portion (e.g., channel region) of the fin structures 110 in the first region 102a includes a sharpened tip profile 145 over a top of the fin structures 110 as shown in FIGS. 1b-1c. The top of the fin structures having the sharpened tip profile protrudes and extend beyond the top surface of the PMD layer 130 as shown in FIG. 1b. The tip over the top of the fin structures in the first region 102a is sufficiently sharp to enable the overlying portion of the interfacial layer of the gate dielectric 152 to breakdown easily during programming relative to the fin structures in the second region 102b having a substantially planar surface profile as shown in FIG. 1d or a gradient surface profile (not shown).

Metal gates 150 are disposed over the substrate in the first and second regions as shown in FIGS. 1a-1d. A metal gate 150, as shown, is disposed over the channel region of the fin structure 110. The metal gate 150 is an elongated member disposed along a second direction (e.g., y-direction) and traverses one or more fin structures 110 in the first or second region as shown in FIG. 1a. The metal gate wraps around and covers exposed top and side surfaces of the fin structure. The metal gate includes a gate dielectric 152 and a metal gate electrode 154 disposed over the gate dielectric. The gate dielectric 152, in one embodiment, includes an interfacial and a high-k gate dielectric stack. The interfacial layer, for example, may be $SiO_2$ and the high-k gate dielectric layer, for example, may be $HfO_2$, HfSiON, $La_2O_3$, zirconium oxide or silicates thereof. The metal gate electrode, for example, includes TaN or TiN. Other suitable types of gate dielectric materials and metal gate electrode materials may also be useful. In one embodiment, the interfacial and high-k gate dielectric stack 152 of the metal gate in the first region 102a lines the PMD layer 130 and the exposed fin structures having the sharpened tip profile 145 as shown in FIGS. 1b-1c. The interfacial and high-k dielectric stack 152 of the metal gate in the second region 102b, in one embodiment, lines the isolation layer 180 and the exposed fin structures having the substantially planar surface profile as shown in FIG. 1d or a gradient surface profile (not shown). As shown in FIG. 1c, a substantially co-planar top surface is formed between the PMD layer 130, gate dielectric 152 and metal gate electrode 154. The metal gates may be configured to function as word lines (WL) for the OTP based memory cell.

In one embodiment, there is no extension/halo or source/drain (S/D) regions disposed adjacent to the metal gates in the first region 102a. In one embodiment, one or more well tap regions (not shown) are formed in the doped well 108 of the first region. For example, the well tap regions are formed in the substrate every 8 or 16 bits to ensure low bit-line resistance. The well tap region includes dopants of a first polarity type for a first polarity type doped well. For example, the well tap region may contain n-type dopants for n-type doped wells. As for the second region 102b, S/D regions (not shown) are disposed in the top fin portions adjacent to sides of the metal gates. The S/D regions include dopants of a first polarity type for a first polarity type device. For example, the S/D regions may contain n-type dopants for an n-type or n-channel device or p-type dopants for a p-type or p-channel device. The well tap and S/D regions, in one embodiment, are heavily doped regions. For example, the dopant concentration of the well tap and S/D regions may be about $10^{18}$-$10^{20}$ atoms/cm$^3$. Other suitable dopant concentration may also be useful.

Via contacts or contact plugs (not shown) are disposed in the PMD layer. For example, contact plugs are disposed over contact regions of the memory cell and logic transistor, such as well tap regions, S/D regions and over the metal gate. The contact plugs, for example, include conductive material such as tungsten, copper, or alloy thereof. Other suitable conductive materials may also be useful. For example, contact plugs couple the well tap regions which connect the doped wells that serve as bitlines of the memory cell and contact plugs couple the metal gates which serve as word lines of the memory cell to interconnects disposed in upper interconnect level. As for the second region, contact plugs couple the S/D regions and metal gates to interconnects disposed in upper interconnect level.

FIGS. 2a-2d show various views of another embodiment of a device 200. FIG. 2a shows a simplified top view of a cross-point memory array in a first region 102a and top view of logic components in a second region 102b while FIGS. 2b-2d show corresponding cross-sectional views. FIG. 2b shows a cross-sectional view of the first region 102a of the device taken along A-A' and FIG. 2c shows a cross-sectional view of the first region taken along B-B'. As for FIG. 2d, it shows a cross-sectional view of the second region 102b of the device taken along C-C'. The device 200 is similar to the device 100 and differs from the device 100 in one or more aspects. In the interest of brevity, the description of device 200 below primarily focuses on the difference(s) between the device 200 and device 100. Common elements or features may not be described or described in detail.

Referring to FIGS. 2a-2d, the substrate 105 includes a plurality of fin structures 110 disposed in the first and second regions 102a-102b. Isolation layer 180 having thickness less than the height of the fin structures is also disposed in the first and second regions to isolate the fin structures. The fin structure 110 has a top fin portion 111 which protrudes beyond the top surface 180a of the isolation layer and a bottom fin portion 112 which is embedded within the isolation layer.

In one embodiment, the entire top fin portion 111 of the fin structures 110 in the first region 102a includes a sharpened tip profile 245 over a top of the fin structures. For example, the channel and non-channel regions of the fin structures 110 in the first region 102a include the sharpened tip profile 245 over a top of the fin structures 110 as shown in FIGS. 2b-2c. In one embodiment, the top of the fin structures having the sharpened tip profile protrudes and extend beyond the top surface of the isolation layer 180 as shown in FIG. 2b. The tip over the top of the fin structures in the first region 102a is sufficiently sharp to enable the overlying portion of the interfacial layer of the gate dielectric 152 to breakdown easily during programming relative to the fin structures in the second region 102b having a substantially planar surface profile as shown in FIG. 2d or a gradient surface profile (not shown).

Metal gates 250 are disposed over the substrate in the first and second regions as shown in FIGS. 2a-2d. A metal gate 250, as shown, is disposed over the channel region of the fin structure 110. The metal gate 250 wraps around and covers exposed top and side surfaces of the fin structure. The metal gate includes a gate dielectric 152 having the interfacial and high-k dielectric stack and a metal gate electrode 154 disposed over the gate dielectric.

In one embodiment, the interfacial and high-k gate dielectric stack 152 of the metal gate in the first region 102a lines the isolation layer 180 and the exposed fin structures having the sharpened tip profile 245 as shown in FIGS. 2b-2c. The interfacial and high-k dielectric stack 152 of the metal gate in the second region 102b, in one embodiment, lines the isolation layer 180 and the exposed fin structures having the substantially planar surface profile as shown in FIG. 2d or a gradient surface profile (not shown). As shown in FIG. 2c, a substantially co-planar top surface is formed between the PMD layer 130, gate dielectric 152 and metal gate electrode 154. The doped wells 108 in the first region may be configured to function as bitlines and the metal gates 250 in the first region may be configured to function as word lines for the OTP based memory cell.

FIGS. 3a-3d show various views of another embodiment of a device 300. FIG. 3a shows a simplified top view of a cross-point memory array in a first region 102a and top view of logic components in a second region 102b while FIGS. 3b-3d show corresponding cross-sectional views. FIG. 3b shows a cross-sectional view of the first region 102a of the device taken along A-A' and FIG. 3c shows a cross-sectional view of the first region taken along B-B'. As for FIG. 3d, it shows a cross-sectional view of the second region 102b of the device taken along C-C'. The device 300 is similar to the device 100 and differs from the device 100 in one or more aspects. In the interest of brevity, the description of device 300 below primarily focuses on the difference(s) between the device 300 and device 100. Common elements or features may not be described or described in detail.

Referring to FIGS. 3a-3d, the substrate 105 includes a plurality of fin structures 110 disposed in the first and second regions 102a-102b. Isolation layer 180 having thickness less than the height of the fin structures is also disposed in the first and second regions to isolate the fin structures. The fin structure 110 has a top fin portion 111 which protrudes beyond the top surface 180a of the isolation layer and a bottom fin portion 112 which is embedded within the isolation layer.

In one embodiment, epitaxial layer is grown on the entire top fin portion 111 (e.g., includes both channel and non-channel regions) of the fin structures 110 in the first region 102a to form raised or elevated top fin portion 310 as shown in FIGS. 3b-3c. As for the second region 102b, epitaxial layer is grown on the non-channel regions of the fin structures to form raised or elevated top fin portion (not shown in FIG. 3d). The raised top fin portion having the epitaxial layer, in one embodiment, includes a faceted cross-section having a sharpened tip profile 345 over a top of the fin structures as shown in FIG. 3b. In one embodiment, the top of the fin structures having the sharpened tip profile protrudes and extends beyond the top surface of the PMD layer 130 in the first region 102a as shown in FIG. 3b. The tip over the raised top fin portion of the fin structures in the first region 102a is sufficiently sharp to enable the overlying portion of the interfacial layer of the gate dielectric 152 to breakdown easily during programming relative to the fin structures in the second region 102*b* having a substantially planar surface profile in the channel region as shown in FIG. 3*d* or a gradient surface profile (not shown) while the non-channel regions of the fin structure include the raised top fin portions having the sharpened tip profile (not shown in FIG. 3*d*). The raised top fin portions over the non-channel regions in the second region, for example, serve as raised S/D regions.

Metal gates 350 are disposed over the substrate in the first and second regions as shown in FIGS. 3*a*-3*d*. A metal gate 350, as shown, is disposed over the channel region of the fin structure 110. The metal gate 350 wraps around and covers exposed top and side surfaces of the fin structure. The metal gate includes a gate dielectric 152 having the interfacial and high-k dielectric stack and a metal gate electrode 154 disposed over the gate dielectric.

In one embodiment, the interfacial and high-k gate dielectric stack 152 of the metal gate in the first region 102*a* lines the PMD layer 130 and the exposed fin structures having the sharpened tip profile 345 as shown in FIGS. 3*b*-3*c*. The interfacial and high-k dielectric stack 152 of the metal gate in the second region 102*b*, in one embodiment, lines the isolation layer 180 and the exposed fin structures having the substantially planar surface profile as shown in FIG. 3*d* or a gradient surface profile (not shown). As shown in FIG. 3*c*, a substantially co-planar top surface is formed between the PMD layer 130, gate dielectric 152 and metal gate electrode 154. The doped wells 108 in the first region may be configured to function as bitlines and the metal gates 350 in the first region 102*a* may be configured to function as word lines for the OTP based memory cell.

FIGS. 4*a*-4*d* show various views of another embodiment of a device 400. FIG. 4*a* shows a simplified top view of a cross-point memory array in a first region 102*a* and top view of logic components in a second region 102*b* while FIGS. 4*b*-4*d* show corresponding cross-sectional views. FIG. 4*b* shows a cross-sectional view of the first region 102*a* of the device taken along A-A' and FIG. 4*c* shows a cross-sectional view of the first region taken along B-B'. As for FIG. 4*d*, it shows a cross-sectional view of the second region 102*b* of the device taken along C-C'. The device 400 is similar to the device 300 and differs from the device 300 in one or more aspects. In the interest of brevity, the description of device 400 below primarily focuses on the difference(s) between the device 400 and the device 300. Common elements or features may not be described or described in detail.

In one embodiment, epitaxial layer is grown on the entire top fin portion 111 (e.g., includes both channel and non-channel regions) of the fin structures 110 in the first and second regions 102*a*-102*b* to form raised or elevated top fin portions 410. The raised top fin portion having the epitaxial layer, in one embodiment, includes a faceted cross-section having a sharpened tip profile 445 over a top of the fin structures as shown in FIGS. 4*b* and 4*d*. In one embodiment, the top of the fin structures having the sharpened tip profile protrudes and extends beyond the top surface 180*a* of the isolation layer in the first and second regions 102*a*-102*b* as shown in FIGS. 4*b* and 4*d*. The tip over the raised top fin portion of the fin structures in the first region 102*a* is sufficiently sharp to enable the overlying portion of the interfacial layer of the gate dielectric 152 to breakdown easily during programming.

Metal gates 450 are disposed over the substrate in the first and second regions as shown in FIGS. 4*a*-4*d*. A metal gate 450, as shown, is disposed over the channel region of the fin structure 110. The metal gate 450 wraps around and covers exposed top and side surfaces of the fin structure. The metal gate includes a gate dielectric 152 having the interfacial and high-k dielectric stack and a metal gate electrode 154 disposed over the gate dielectric.

In one embodiment, the interfacial and high-k gate dielectric stack 152 of the metal gate lines the isolation layer 180 and the exposed fin structures with sharpened tip profile 445 in the first and second regions as shown in FIGS. 4*b* and 4*d*. As shown in FIG. 4*c*, a substantially co-planar top surface is formed between the PMD layer 130, gate dielectric 152 and metal gate electrode 154. The doped wells 108 in the first region may be configured to function as bitlines and the metal gates 450 in the first region may be configured to function as word lines for the OTP based memory cell.

FIGS. 5*a*-5*c* show various views of another embodiment of a device 500. FIG. 5*a* shows a simplified top view of a cross-point memory array in a first (or memory) region 102*a* of the device. FIG. 5*b* shows a simplified 3-D view of the first region of the device while FIG. 5*c* shows a cross-sectional view of the first region taken along A-A'. The device 500 is similar to the device 100 and differs from the device 100 in one or more aspects. In the interest of brevity, the description of device 500 below primarily focuses on the difference(s) between the device 500 and device 100. Common elements or features may not be described or described in detail.

In one embodiment, the substrate 105 is processed to form a plurality of nanowires 1110 in the first region 102*a*. For simplicity and illustration purpose, only the nanowire portions of the first (or memory) region 102*a* is shown while substrate portions which hold the nanowires in the first region and nanowires in the second region 102*b* are omitted from the figures. In one embodiment, the nanowires 1110 include a sharpened tip 545 at top of the nanowires as shown in FIGS. 5*b* and 5*c*. The tip over the top of the nanowires in the first region 102*a* is sufficiently sharp to enable the overlying portion of the interfacial layer of the gate dielectric 152 to breakdown easily during programming.

Metal gate 550 is disposed over the substrate in the first region 102*a* and second region 102*b* (not shown in FIGS. 5*a*-5*c*). A metal gate 550, as shown, is disposed over the channel region of the nanowires 1110. The metal gate 550 wraps around and covers exposed top and side surfaces of the nanowire. The metal gate includes a gate dielectric 152 having the interfacial and high-k dielectric stack and a metal gate electrode 154 disposed over the gate dielectric.

In one embodiment, the interfacial and high-k gate dielectric stack 152 of the metal gate lines the exposed portions of the nanowires having the sharpened tip profile 545 in the first region 102*a* as shown in FIGS. 5*b* and 5*c*. The nanowires 1110 in the first region may be configured to function as bitlines and the metal gate 550 in the first region 102*a* may be configured to function as word line for the OTP based memory cell.

As described in FIGS. 1*a*, 2*a*, 3*a*, 4*a* and 5*a*, the memory array shown is a cross-point anti-fuse based OTP memory array. An OTP memory cell of the memory array shown in FIGS. 1*a*, 2*a*, 3*a*, 4*a* and 5*a* is programmed by selecting a bit at the intersection of a metal gate and a bitline in a doped well through supplying a higher positive voltage to the metal gate which drives the bitline to accumulation. A high electric field is created across the gate dielectric which causes dielectric breakdown at the sharpened tip location. Meanwhile, a lower positive voltage is supplied to unselected word lines and bitlines to prevent disturbance. The gate dielectric breakdown forms a self-rectifying feature with non-linear I-V characteristics over the doped well at the selected bit which serves as a selector. This eliminates the use of select transistor, resulting in a simplified OTP array design and smaller bit-cell area.

In addition, the embodiments as described in FIGS. 1a-1d, FIGS. 2a-2d, FIGS. 3a-3d, FIGS. 4a-4d and FIGS. 5a-5c result in further advantages. As described, at least a portion (e.g., channel region) of the fin structures 110 or nanowires 1110 in the first region 102a includes a sharpened tip profile over a top of the fin structures or nanowires. The sharpened fin tip is advantageous as it enhances the electric field. Thus, the portion of the interfacial layer of the gate dielectric overlying the sharpened tip can breakdown easily. Such configuration also enables lower power consumption and faster speed to be achieved relative to conventional OTP structures. A reduced programming voltage also improves the compatibility of power supply with logic devices on the same substrate.

FIGS. 6a-6h show cross-sectional views of an embodiment of a process 600 for forming a device 100. In one embodiment, the process allows memory cells and logic devices to be formed simultaneously on the same substrate using logic processing. The memory cell, in one embodiment, is an anti-fuse based OTP memory cell. The device 100 formed, for example, is the same as that shown and described in FIGS. 1a-1d. Common elements and elements having the same reference numerals may not be described or described in detail.

Referring to FIG. 6a, a substrate 105 is provided. The substrate may be a silicon substrate. The substrate may be lightly doped with second polarity type dopants, such as, p-type dopants. Providing other suitable types of substrates, including SiGe, Ge and group III-V semiconductors such as GaAs, InP and InAs, including substrates doped with other types of dopants or undoped substrates, are also useful. Other suitable types of substrate, such as crystalline-on-insulator which includes SOI type of substrate, may also be useful.

As shown, the substrate may be prepared with at least first and second device regions. In one embodiment, the first region serves as a memory or array region for a plurality of anti-fuse based OTP memory cells. The second region 102b, in one embodiment, serves as a logic region for logic transistors. Although two device regions are shown, it is understood that the substrate may include numerous device regions (not shown). The numerous device regions may include different types of device regions for other types of devices.

The substrate 105 is processed to form fin structures 110. In one embodiment, a fin structure has sufficient length for the body or channel and non-channel regions of the memory cell or logic transistor, such as that described in, for example, FIGS. 1a-1d. The height of the fin structure should be sufficient to provide top and bottom fin portions which serve as a body of the transistor. The height of the fin, for example, may be about 40-50 nm. As for the width, it may be about 5-30 nm. Other suitable fin dimensions may also be useful.

Forming the fin structures may be achieved using various methods. The fin structure, for example, may be formed by patterning the substrate. For example, a patterned hard mask (not shown) is formed over the substrate. In one embodiment, a hard mask layer (not shown), such as silicon oxide or silicon nitride, is formed on the substrate 105. Other suitable types of materials which are selective to the isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structures. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist is transferred to the hard mask by, for example, an anisotropic etch, such as a reactive ion etch (RIE). The soft mask is removed. An anisotropic etch, such as RIE, is performed to remove portions of the substrate surface unprotected by the hard mask, leaving fin structures 110 in the first and second regions 102a-102b disposed on the top surface of the substrate. Other suitable methods may also be employed to form the fin structure. Although two fin structures are formed in each of the first and second regions, it is understood that other suitable number of fin structures may be formed on the same substrate 105. Depending on processing, the fin structure, for example, includes substantially planar surface profile as shown in FIG. 6a or a gradient surface profile (not shown).

The process continues to form an isolation layer. The isolation layer, such as a dielectric layer which includes a silicon oxide layer, is formed over the substrate 105 covering the fin structures 110 in the first and second regions 102a-102b. Other suitable types of dielectric layer may also be useful. The isolation layer, for example, may be formed over the substrate using CVD or high aspect ratio process (HARP). Other suitable techniques for forming the isolation layer may also be useful. In one embodiment, a polishing process, such as a chemical mechanical polishing process (CMP) is performed to planarize the isolation layer to the top surface of the hard mask (not shown) over the fin structures. A removal process, such as selective to the isolation layer which includes oxide material, is performed to remove or recess portions of the oxide to form the isolation layer 180 as shown in FIG. 6a. The removal process may include dry etch, wet etch or a combination thereof. The isolation layer, for example, has a height or thickness sufficient to provide isolation from the substrate below and between adjacent fin structures. For example, the isolation layer is recessed to a thickness which is less than the height of the fin structures. As shown, the fin structure has a top fin portion 111 which protrudes beyond the top surface 180a of the isolation layer and a bottom fin portion 112 which is embedded within the isolation layer. The thickness of the isolation layer, for example, may be about 100-500 nm. Other suitable thickness ranges may also be useful.

Doped wells 108 are formed in the first and second regions 102a-102b of the substrate. The doped wells include first polarity type dopants, such as n-type dopants, forming n-type doped wells. In one embodiment, the doped wells are formed to a depth greater than the bottom of the isolation regions. The doped wells may be formed by ion implantation having dopant concentration of about $10^{17}$-$10^{19}$ atoms/cm$^3$. Other suitable dopant concentrations may also be useful. An implant mask may be used to facilitate forming the doped wells. A patterned photoresist may be used as the implant mask. In one embodiment, the doped wells 108 in the first region serve as bitlines for the anti-fuse based OTP memory cell.

Figure 6B:
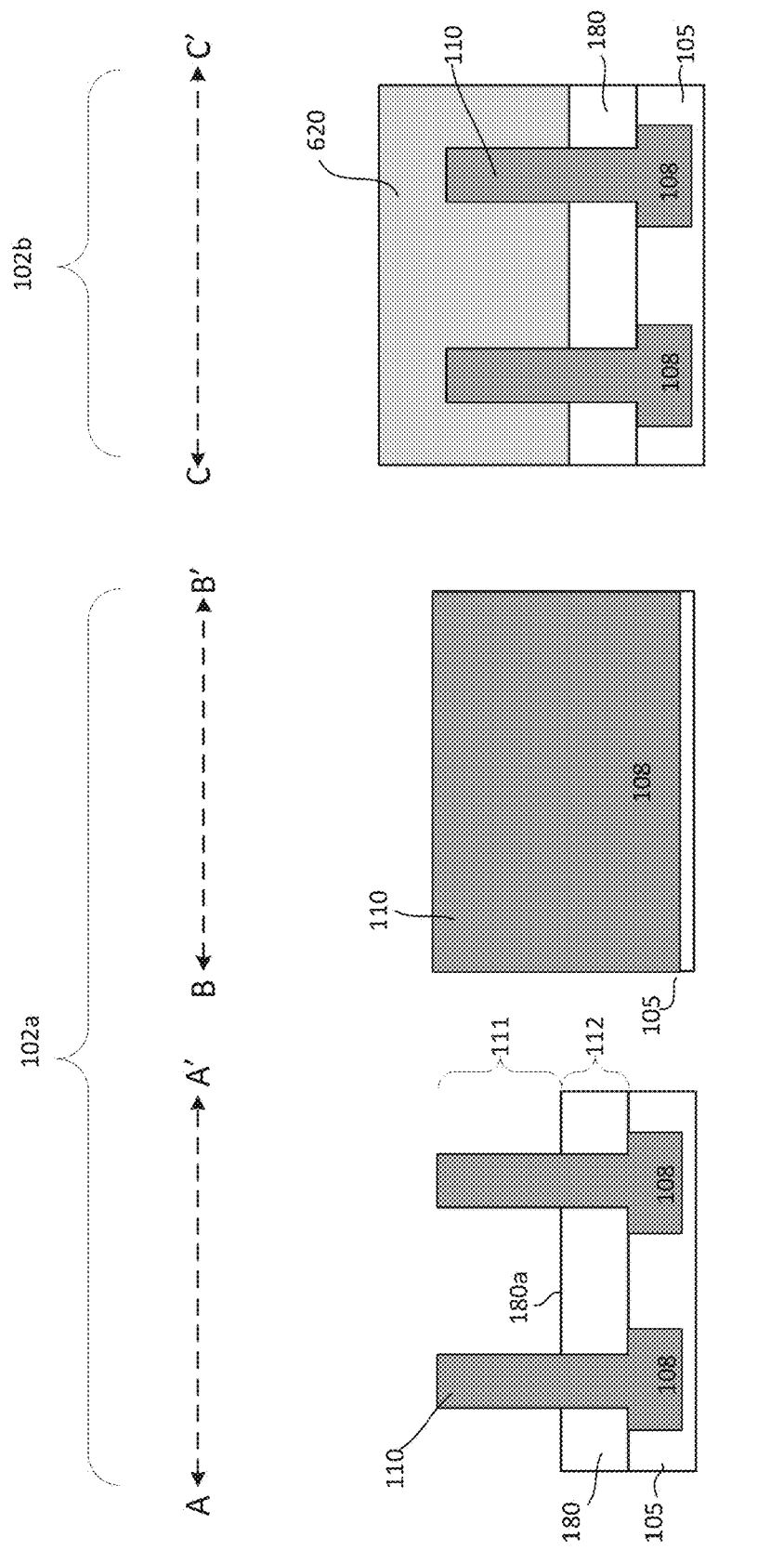

Referring to FIG. 6b, the process continues to form dummy gate 620. For example, a dummy gate dielectric layer and a dummy gate electrode layer are conformally formed over the substrate in the first and second regions covering the fin structures. In the case of a dummy gate, it may be formed of any type of material which can be selectively removed from the fin and a subsequently formed dielectric layer. For example, the dummy gate electrode layer may include polysilicon while the dummy gate dielectric layer may include silicon nitride or silicon oxide. Other suitable types of materials may also be used for the dummy gate layers. The dummy gate dielectric and dummy gate electrode layers are patterned to form a patterned gate 620 which serves as a dummy gate in the second (or logic) region 102*b*. For example, suitable mask and etch techniques may be employed to remove exposed portions of the dummy gate dielectric and dummy gate electrode layers from the first (or memory) region 102*a* while dummy gate dielectric and dummy gate electrode layers protected by the mask remain and serve as the dummy gate 620 in the second region 102*b*. The dummy gate, for example, wrap around and traverses the channel region of the fin structures 110 in the second region 102*b*.

The process continues with front-end-of-line (FEOL) logic processing. For example, the process continues to form sidewalls spacers (not shown) and source/drain (S/D) regions (not shown) in the second region and one or more well tap regions in the first region. The sidewall spacers, for example, include silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques for forming the spacer dielectric layer or forming other types of spacers may also be useful. The spacer dielectric layer is anisotropically etched, such as by RIE, to remove horizontal portions, leaving non-horizontal portions on the sidewalls of the dummy gate as the spacers.

The process continues, for example, to form S/D regions (not shown) in the second region and one or more well tap regions in the first region. The S/D regions include first polarity type dopants for first polarity type device in the second region and the well tap region includes the same polarity type of dopants as the doped well in the first region. For example, the S/D regions may contain n-type dopants for an n-type or n-channel device or p-type dopants for a p-type or p-channel device and the well tap regions include n-type dopants for n-type doped well. In one embodiment, the S/D regions in the second region may be formed together with the well tap regions in the first region if they include the same polarity type of dopants. In other embodiments, the S/D regions in the second region and the well tap regions in the first region may be formed separately if they include different polarity type of dopants. The S/D regions and well tap regions, in one embodiment, are heavily doped regions. For example, the dopant concentration of the S/D and well tap regions may be about $10^{18}$-$10^{20}$ atoms/cm$^3$. The heavily doped well tap and S/D regions are formed by, for example, implanting suitable polarity type dopants using suitable implant mask and ion implantation techniques. The dopant concentration and process parameters of the implantation, such as dose and energy, may be appropriately selected based on design requirements. The heavily doped well tap and S/D regions are formed in exposed top fin portion of the fin structures in the first and second regions. For example, top fin portions of the fin structures in the first region 102*a* not shielded by the implant mask (not shown) and top portion of the fin structures not shielded by the dummy gate in the second region 102*b* are implanted with suitable polarity type dopants to form the heavily doped well tap and S/D regions. Metal silicide contacts (not shown) may also be formed on the contact regions of the device, such as the well tap and S/D regions.

A dielectric liner (not shown) may be provided over the substrate. The dielectric liner, for example, serves as a contact etch stop layer and/or a stress layer. The dielectric liner may be silicon nitride. Other suitable types of dielectric materials for the dielectric liner may also be useful. The dielectric liner, for example, is formed by CVD, covering the fin structures and the dummy gate. Other suitable techniques for forming the dielectric liner may also be useful.

Figure 6C:
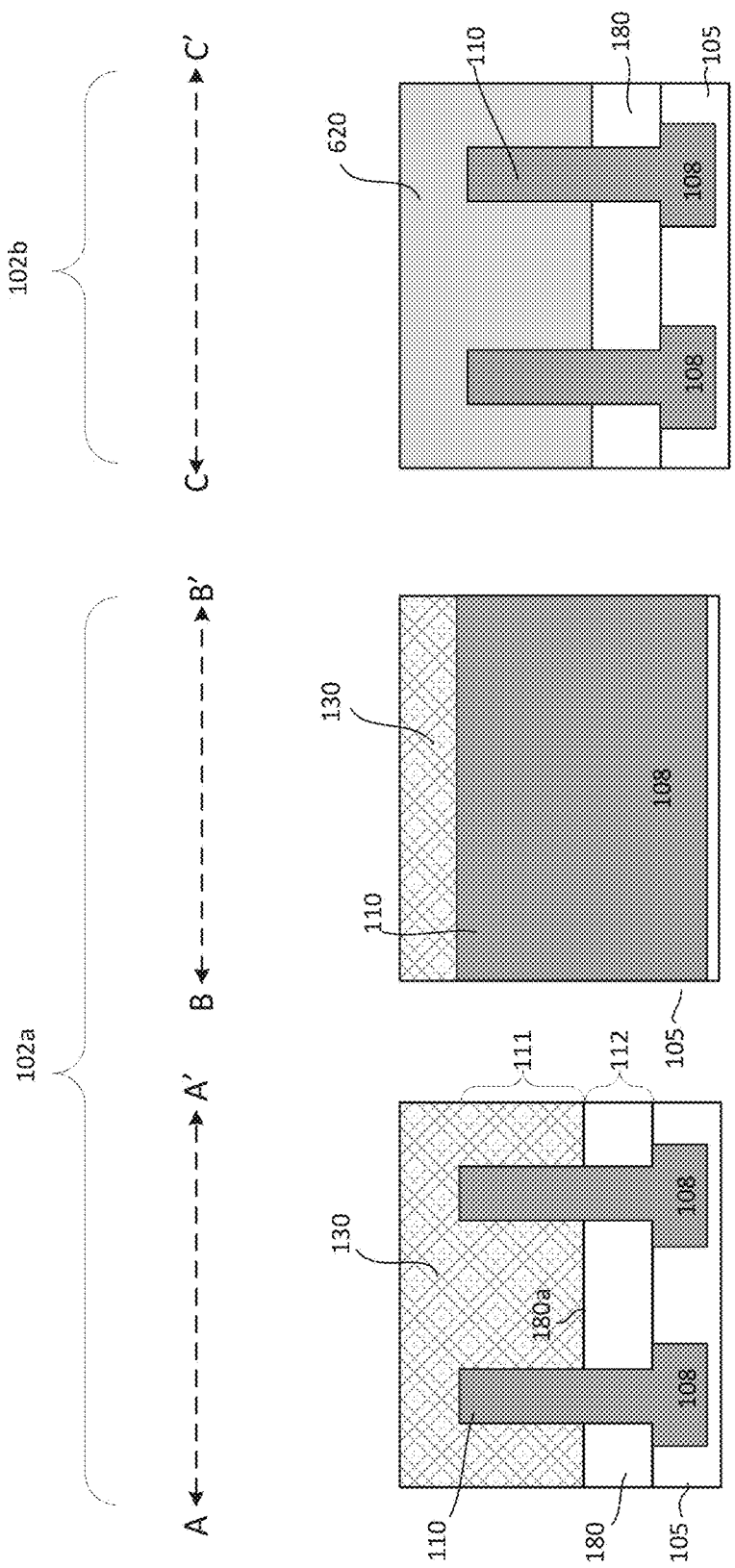

Referring to FIG. 6*c*, a dielectric layer 130 is formed on the substrate in the first and second regions, covering the fin structures 110 and dummy gate 620. The dielectric layer, for example, serves as a PMD layer. The dielectric layer, for example, includes a silicon oxide layer and is formed by CVD. Other suitable types of dielectric layer and forming techniques may also be useful. The PMD layer is planarized. The planarizing process, for example, is a CMP process. The planarizing process removes excess dielectric or PMD layer, forming a planar top surface and a co-planar top surface (not shown in C-C' cross section) with the dummy gate 620.

After planarization, the exposed dummy gate 620 in the second region 102*b* is selectively removed as shown in FIG. 6*d*. Removal of the dummy gate may be performed by dry etch, wet etch or a combination thereof. For example, a wet etch selective to the dielectric layer 130 (not shown in C-C' cross section) and sidewall spacers (not shown) may be performed. The dummy gate may be removed by wet etch using different chemistries. Removal of the dummy gate leaves a gate trench or gate opening 632 on the substrate and exposes portion (e.g., channel regions) of the fin structures 110 in the second region 102*b* while the dielectric layer 130 protects and covers the other portions of the fin structures in the second region and the fin structures in the first region 102*a*.

Figure 6E:
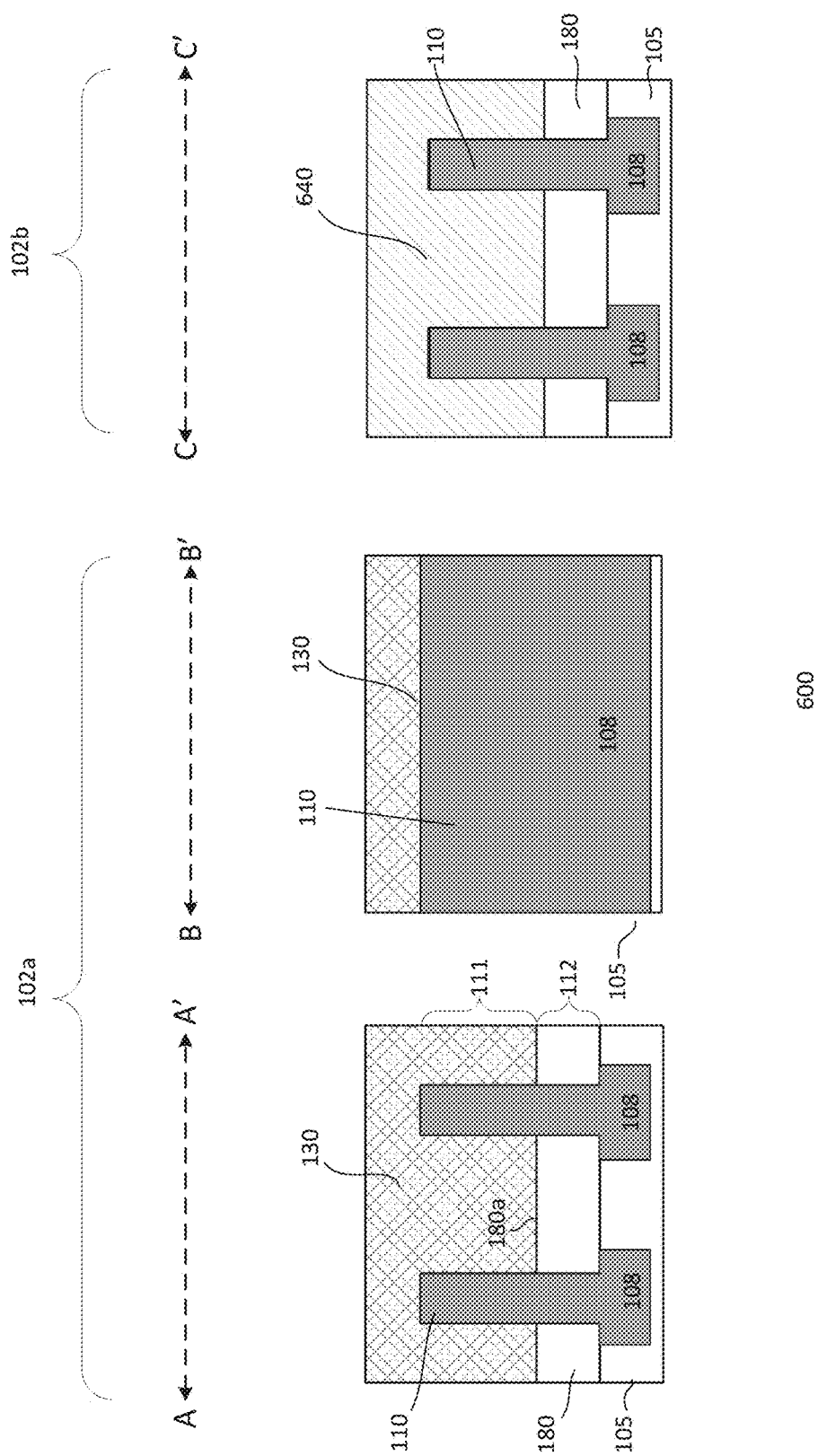
Figure 6F:
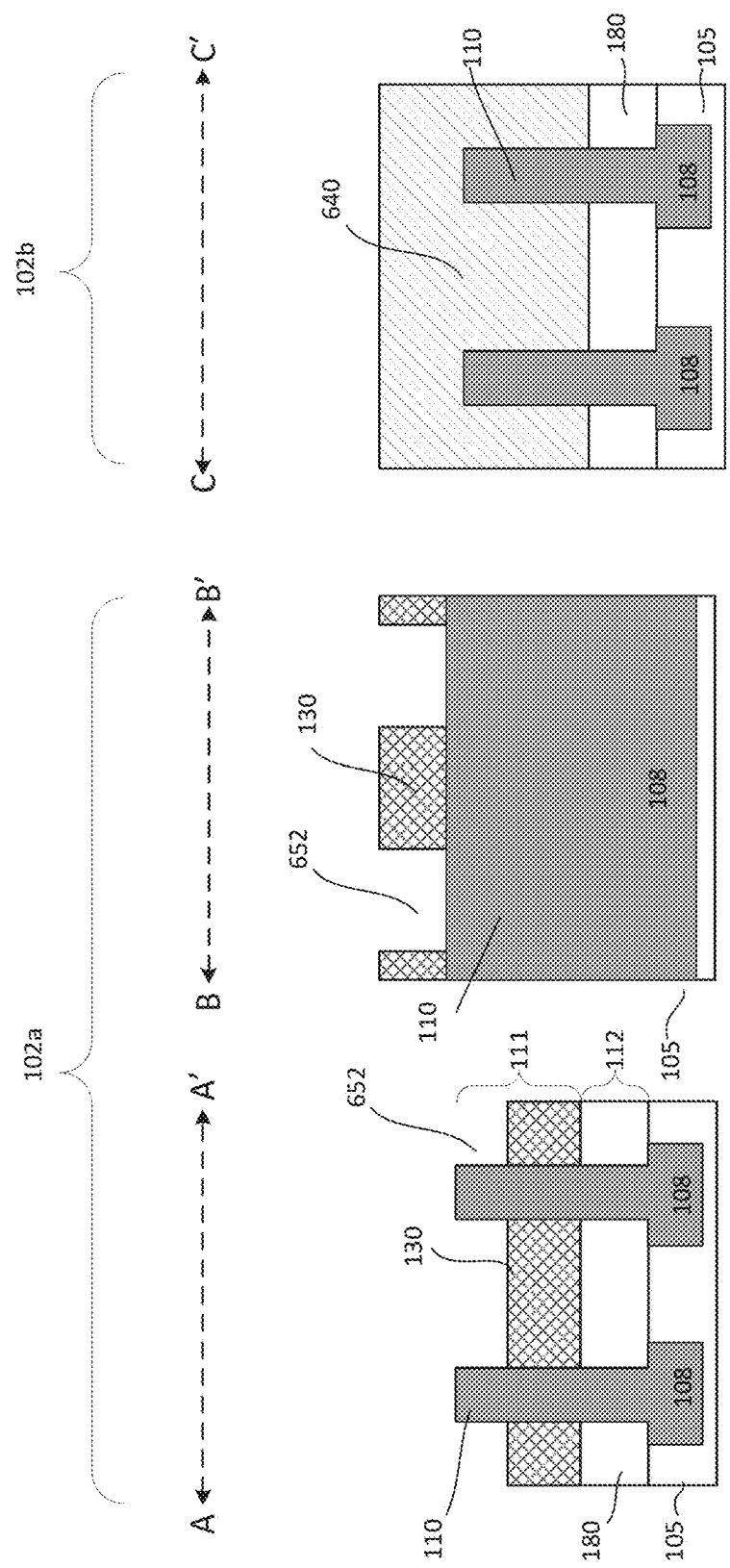

In one embodiment, the process continues to form a protective mask 640 in the second region 102*b*. The protective mask, for example, includes photoresist material and fills the gate trench 632 in the second region as shown in FIG. 6*e*. Other suitable material may also be used as the protective mask. In one embodiment, the dielectric layer 130 is patterned to remove portions of the dielectric layer in the first region 102*a*. The dielectric layer, for example, may be patterned using suitable mask and etch techniques. The patterning process, in one embodiment, reduces thickness of the dielectric layer and form gate openings 652 corresponding to locations (e.g., channel region) where metal gates will be formed in the first region 102*a* later. As shown in FIG. 6*f*, the patterning process exposes an upper portion of the top fin portion 111 of the fin structures while lower portion of the top fin portion of the fin structures in the first region 102*a* are embedded within the PMD layer. The protective mask 640 protects and covers the fin structures in the second region 102*b* as shown in FIG. 6*f*.

Figure 6G:
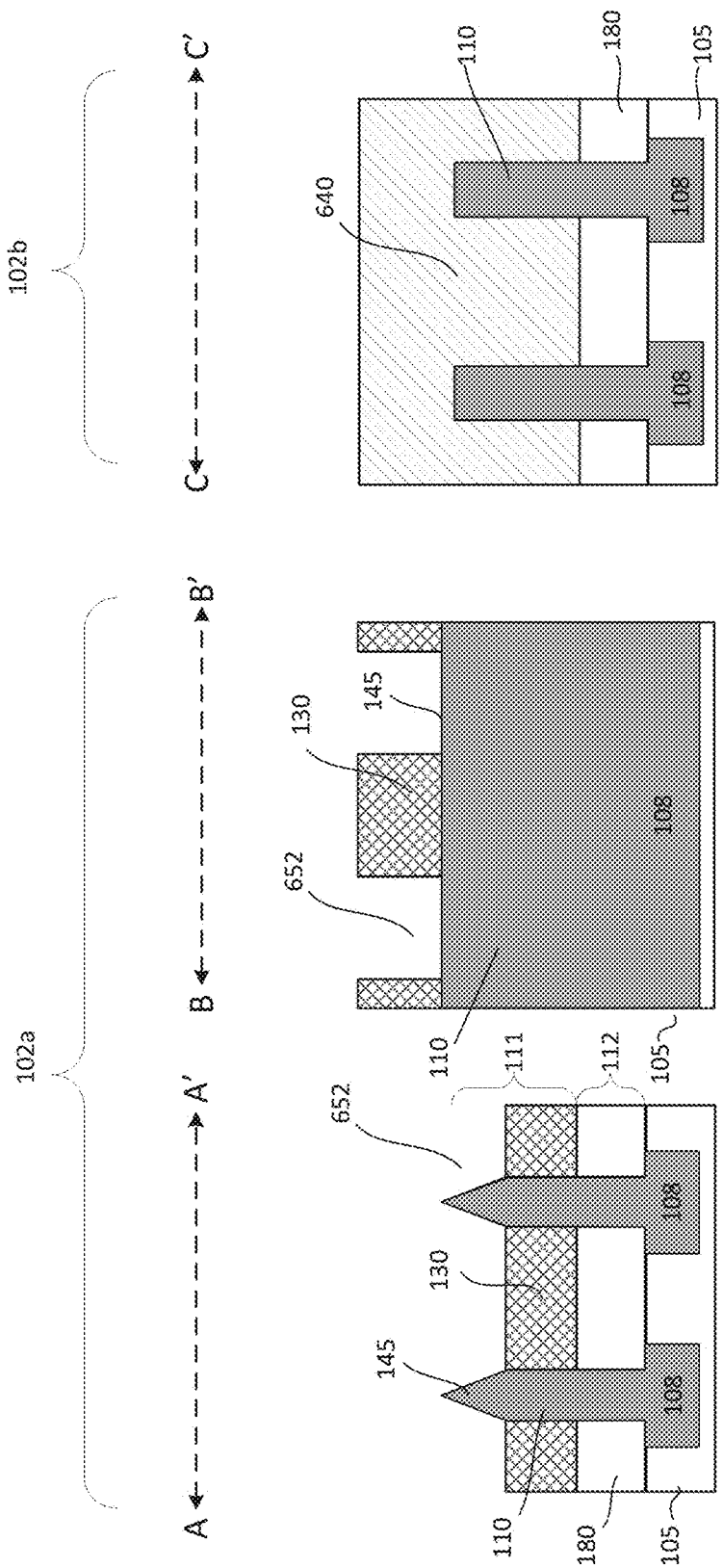

In one embodiment, the exposed upper portion (e.g., channel region) of the fin structures are processed to form a sharpened tip profile 145 over a top of the fin structures 110 in the first region 102*a* as shown in FIG. 6*g*. The sharpened tip profile over the top of the fin structures in the first region 102*a*, in one embodiment, may be achieved using suitable etch process such as wet etch, dry etch or a combination thereof.

In one embodiment, the etch process utilizes a wet etch having chemistry that is highly selective to a first crystallographic plane of the fin structure relative to a second crystallographic plane of the fin structure. For instance, the wet etch preferentially etches the fin structure based on crystallographic direction. The wet etch, for example, etches the fin structure much more rapidly along a first crystallographic direction to form a sharpened tip profile at the top of the fin structure as the etch proceeds much more slowly in other crystallographic directions. The process parameters and the etch chemistries may be appropriately selected based on crystallographic direction of the fin and should be selective to the PMD layer. As an example, the wet etch preferably etches the fin structure much more slowly along a $\{111\}$ plane to form the $\{111\}$ facet as the etch proceeds much more rapidly in other crystallographic directions. The wet etch chemistries may include $NH_4OH$, $NH_3OH$, TMAH, KOH, NaOH, BTMH or an amine-based etchant. Other suitable process parameters and etchants may also be useful. The etch process, for example, substantially proceeds along the preferred crystallographic plane of the fin structure until the desired sharpened tip profile 145 which is sufficiently sharp to enable a later formed interfacial layer of a gate dielectric to breakdown easily during programming is achieved on the top of the fin structures 110 in the first region 102a. As shown, the fin structures in the first region include the sharpened tip profile while the fin structures 110 in the second region 102b remain unchanged with substantially planar surface profile as shown in FIG. 6g or a gradient surface profile (not shown) as they are protected by the protective mask.

In an alternate embodiment, the sharpened tip profile 145 may be achieved by employing an anisotropic etch followed by a plasma etch. As an example, the sharpened tip profile on the top of the fin structures may be achieved by performing the anisotropic etch in a KOH solution followed by $SF_6$ plasma etch. The tip may be further sharpened using thermal oxidation technique to decrease the cone angle and, therefore obtain a smaller curvature radii. Other suitable techniques may also be employed to form the desired tip profile.

The protective mask 640 is removed after forming the desired tip profile on the top of the fin structures in the first region. The protective mask, for example, may be removed by ashing. Other suitable techniques may be employed to remove the protective mask, depending on the material of the protective mask. The removal of the protective mask, for example, exposes the fin portions in the gate openings in the second region.

Figure 6H:
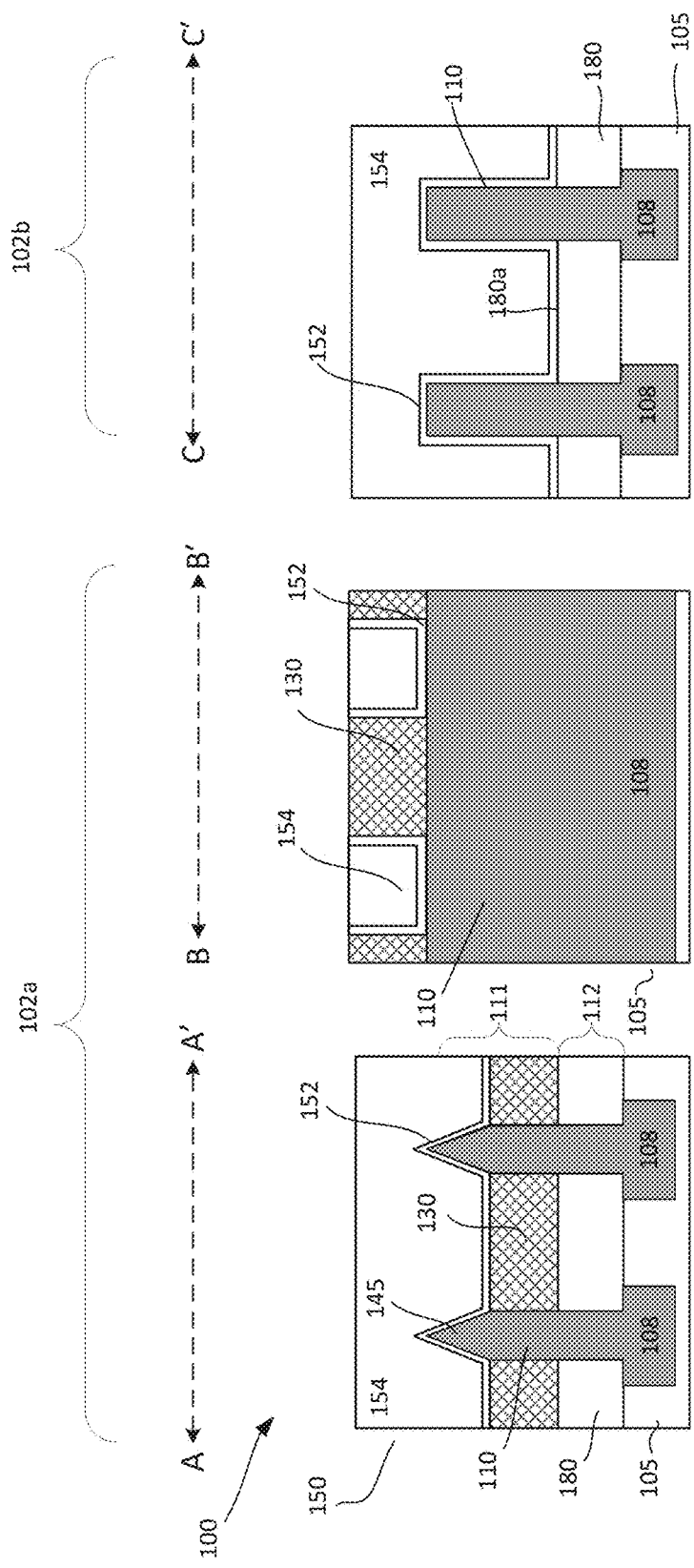

The process continues to form high-k metal gate stack layers on the substrate and in the gate openings in the first and second regions. Forming the metal gate stack layers includes forming a gate dielectric layer and a metal gate electrode layer on the substrate and filling the gate openings in the first and second regions. The gate dielectric layer, in one embodiment, includes an interfacial and a high-k gate dielectric stack. The interfacial and high-k gate dielectric stack layers line the gate openings and PMD layer. The interfacial layer, for example, may be $SiO_2$ and the high-k gate dielectric layer, for example, may be $HfO_2$, HfSiON, $La_2O_3$, zirconium oxide or silicates thereof formed by atomic layer deposition (ALD) process. A metal gate electrode layer, such as TaN or TiN, may be formed over the dielectric layers by ALD, CVD or physical vapor deposition (PVD). Other types of gate dielectric materials, electrode materials or forming techniques may also be useful. These layers are planarized, forming a planar top surface between the PMD layer 130, gate dielectric 152 and metal gate electrode 154 to form the metal gate 150 as shown in FIG. 6h. The metal gates are configured to function as word lines of the anti-fuse based OTP memory cell. As shown, the interfacial and high-k gate dielectric layers 152 are disposed over the PMD layer 130 and wrap around the exposed top of the fin structures 110 having the sharpened tip profile 145 in the first region 120a while the interfacial and high-k dielectric layers 152 are disposed over the isolation layer 180 and wrap around the exposed top of the fin structures having substantially planar surface profile as shown in FIG. 6h or a gradient surface profile (not shown) in the second region 102b.

After forming the metal gate, the process continues to form the device. Additional processes may be performed to complete the formation of the device. For example, additional processes include forming via contacts or contact plugs to contact regions of the memory cells and logic transistors. For example, contact openings are formed to the exposed contact regions, such as well tap regions, S/D regions and over the metal gate. Conductive material fills the via openings to form the contact plugs. For example, the contact plugs couple the well tap regions disposed in the doped wells which serve as bitlines of the memory cell to an upper interconnect level and contact plugs are coupled to metal gates which serve as word lines of the memory cell to the upper interconnect level. As for the second region, contact plugs couple the S/D regions and metal gate of the logic transistor to an upper interconnect level. Additional processes may include back-end-of-line (BEOL) process to finish the manufacturing of the device, such as forming of one or more interconnect levels, final passivation, dicing, assembly, packaging and testing. Other processes are also useful.

FIGS. 7a-7f show another embodiment of a process 700 for forming a device 200. The process 700 is similar to the process 600 shown in FIGS. 6a-6h. The device 200 formed, for example, is the same as that shown and described in FIGS. 2a-2d. In the interest of brevity, the description below will focus primarily the difference(s) between these processes and common elements and processes may not be described or described in detail.

Figure 7A:
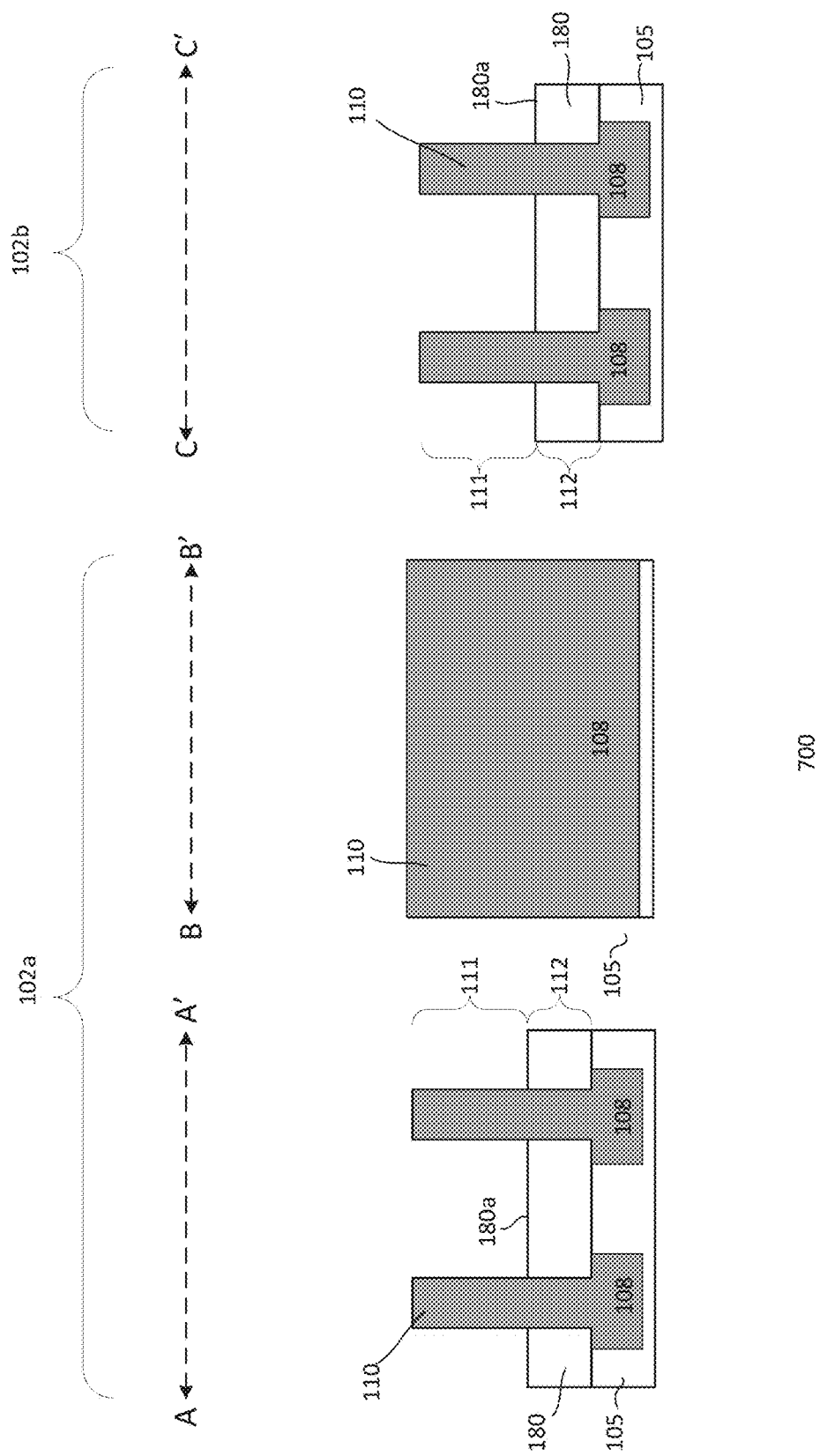
FIGS. 7a-7f show cross-sectional views of another embodiment of a process for forming a device.

As shown in FIG. 7a, the substrate is processed at the same stage as that described in FIG. 6a. For example, the substrate is processed to form fin structures 110 and doped wells 108 in the substrate below the fin structures in the first and second regions 102a-102b. Isolation layer 180 having thickness less than the height of the fin structures is also formed in the first and second regions to isolate the fin structures.

Figure 7B:
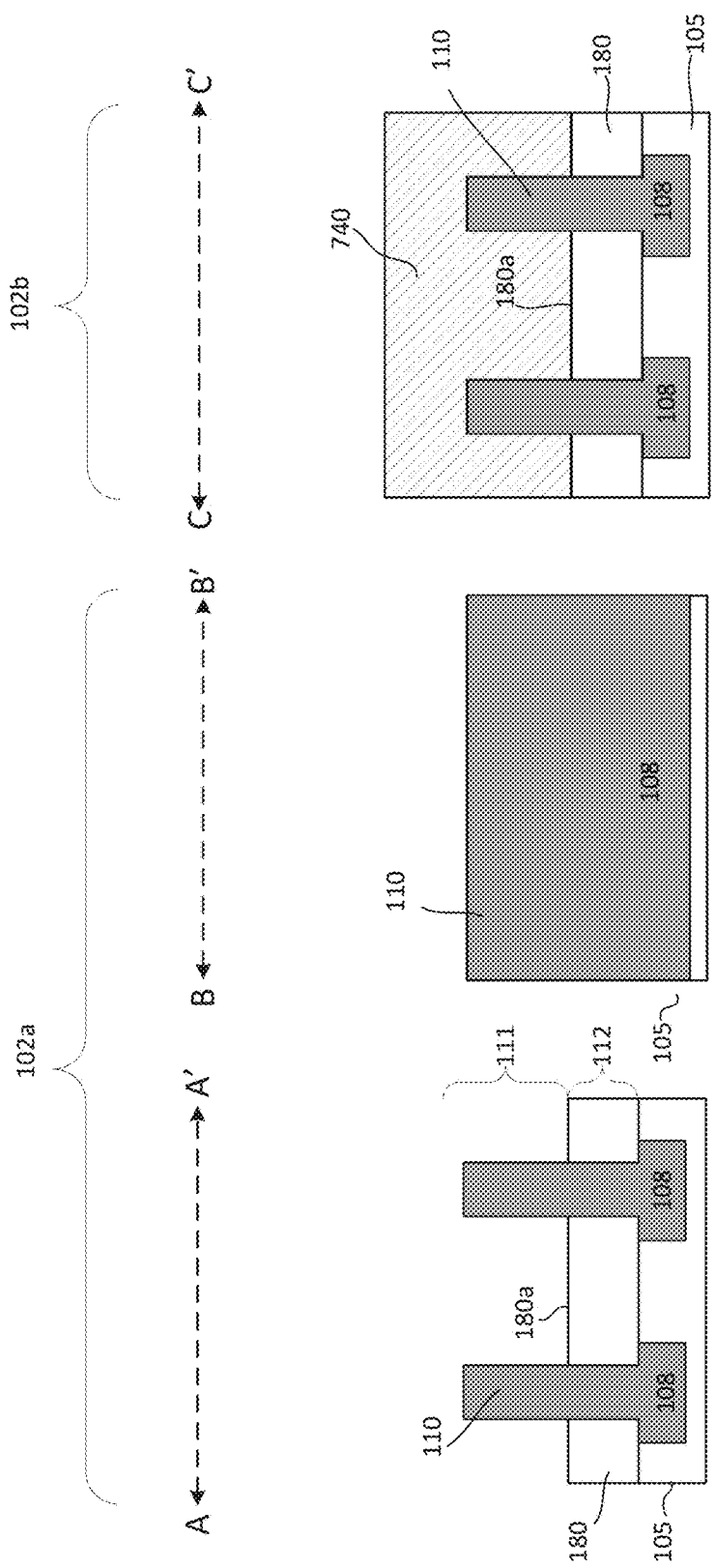

In one embodiment, the process continues to form a protective mask 740 in the second region 102b as shown in FIG. 7b. The protective mask 740, for example, includes the same material as the protective mask 640 and is formed by the same technique as described in FIG. 6e. As shown, the protective mask is formed over the isolation layer 180 and covers the exposed top fin portion 111 of the fin structures in the second region 102b while the top fin portion 111 of the fin structures which extends over the isolation layer in the first region 102a is exposed for further processing.

Figure 7C:
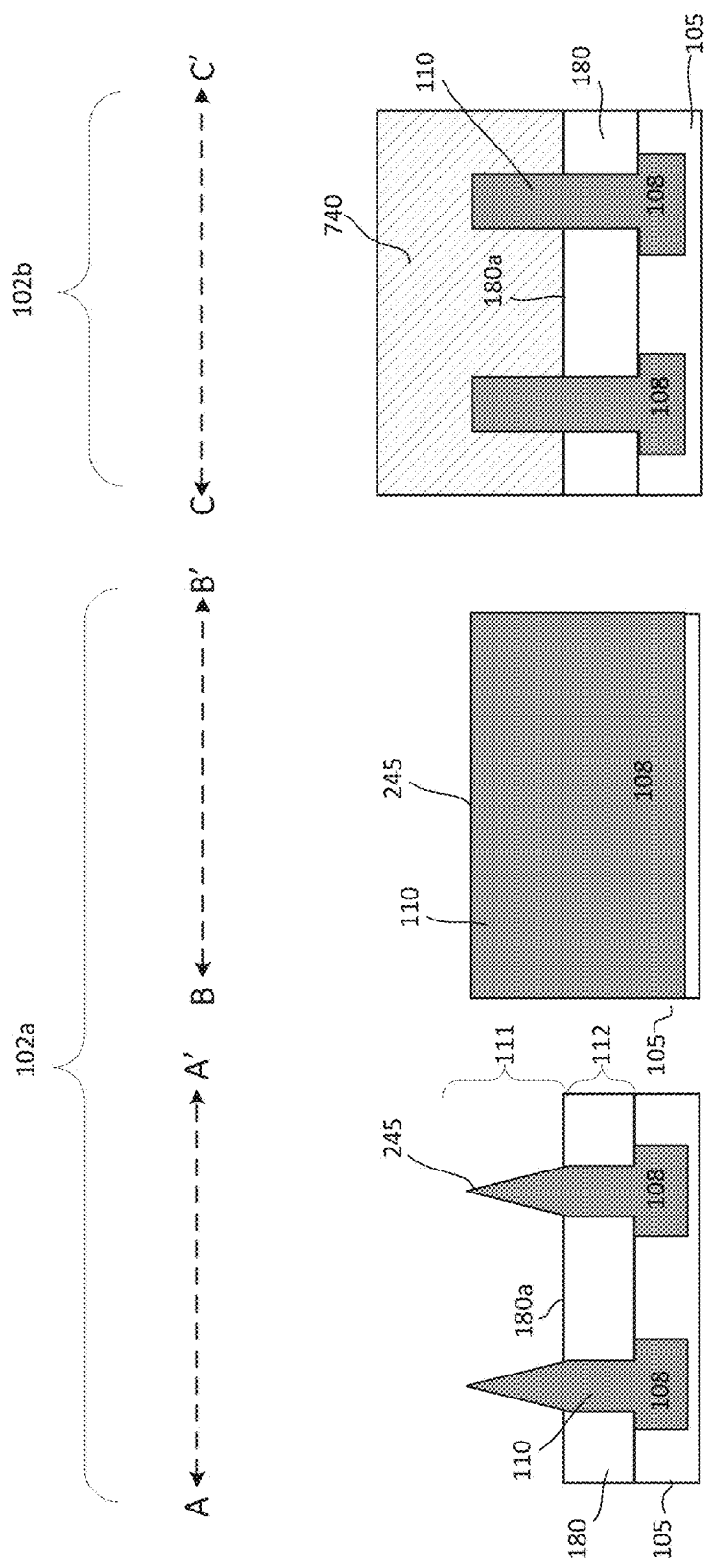

In one embodiment, the exposed top fin portion 111 (e.g., including channel and non-channel regions) of the fin structures in the first region 102a is processed to form a sharpened tip profile 245 over a top of the fin structures 110 in the first region 102a as shown in FIG. 7c. The sharpened tip profile over the top of the fin structures in the first region, in one embodiment, may be achieved using suitable etch process such as those described with respect to FIG. 6g above. The etch process, for example, utilizes chemistry that is highly selective to a first crystallographic plane of the fin structure relative to a second crystallographic plane of the fin structure. The etch process, for example, substantially proceeds along the preferred crystallographic plane of the fin structure until the desired sharpened tip profile which is sufficiently sharp to enable a later formed interfacial layer of a gate dielectric to breakdown easily during programming is achieved on the top of the fin structures in the first region. As shown, the fin structures 110 in the first region 102a include the desired tip profile 245 while the fin structures 110 in the second region 102b remain unchanged with substantially planar surface profile as shown in FIG. 7c or a gradient surface profile (not shown) as they are protected by the protective mask 740.

Figure 7D:
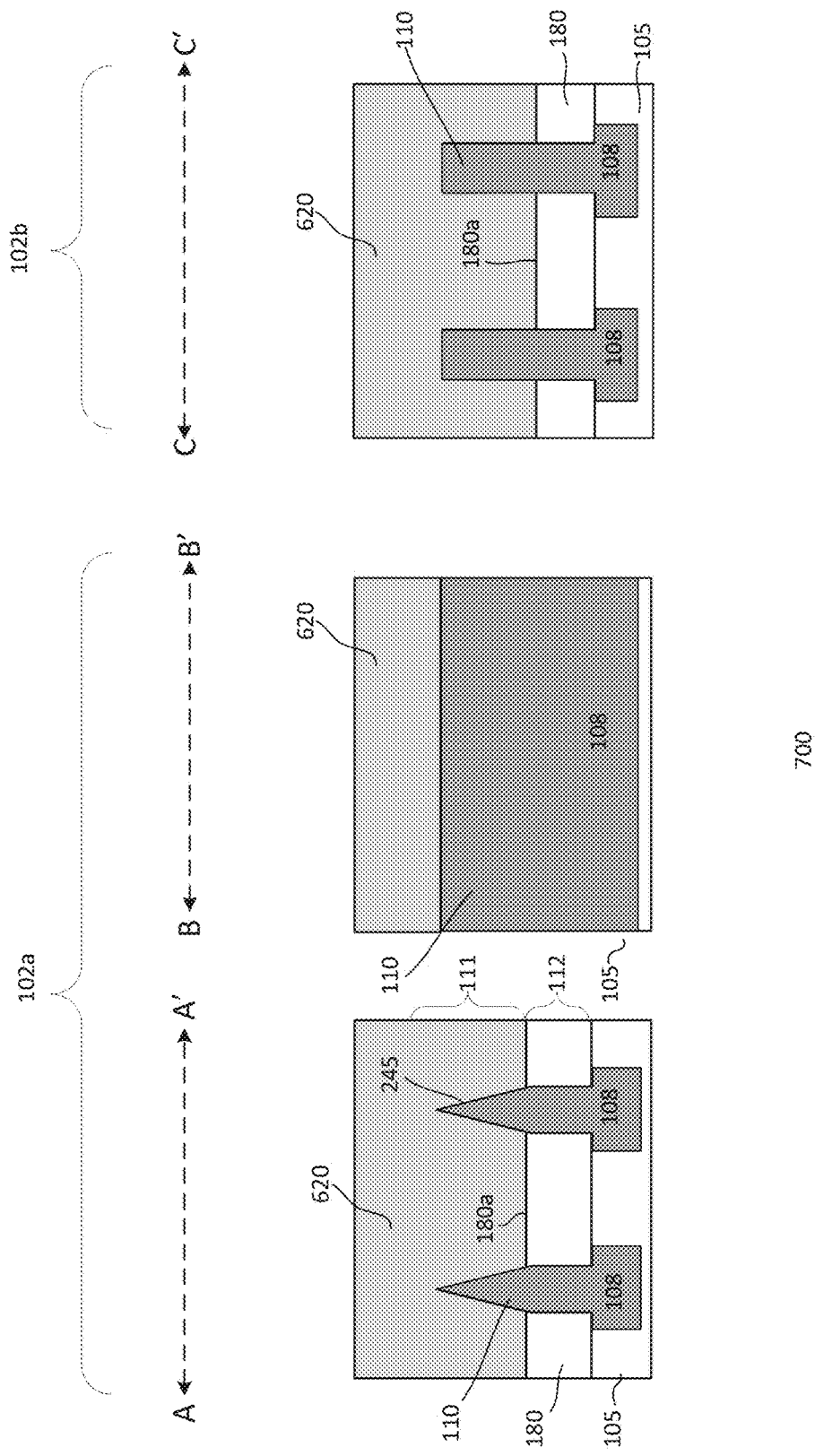

The protective mask is removed after forming the desired sharpened tip profile on the top of the fin structures in the first region using suitable techniques. This exposes top fin portion 111 of the fin structures 110 and isolation layer 180 in the first and second regions. In one embodiment, the process continues to form dummy gates. For example, a dummy gate dielectric layer and a dummy gate electrode layer are conformally formed over the substrate in the first and second regions covering the fin structures as shown in FIG. 7d. Materials and techniques for forming the dummy gate layers are the same as that described with respect to FIG. 6b above. In one embodiment, the dummy gate layers are patterned to form patterned gates which serve as dummy gates 620 in the first and second regions 102a-102b. For example, suitable mask and etch techniques may be employed to remove exposed portions of the dummy gate layers from the first and second regions. The dummy gates, for example, traverse and wrap around the channel region of the fin structures in the first and second regions.

Figure 7E:
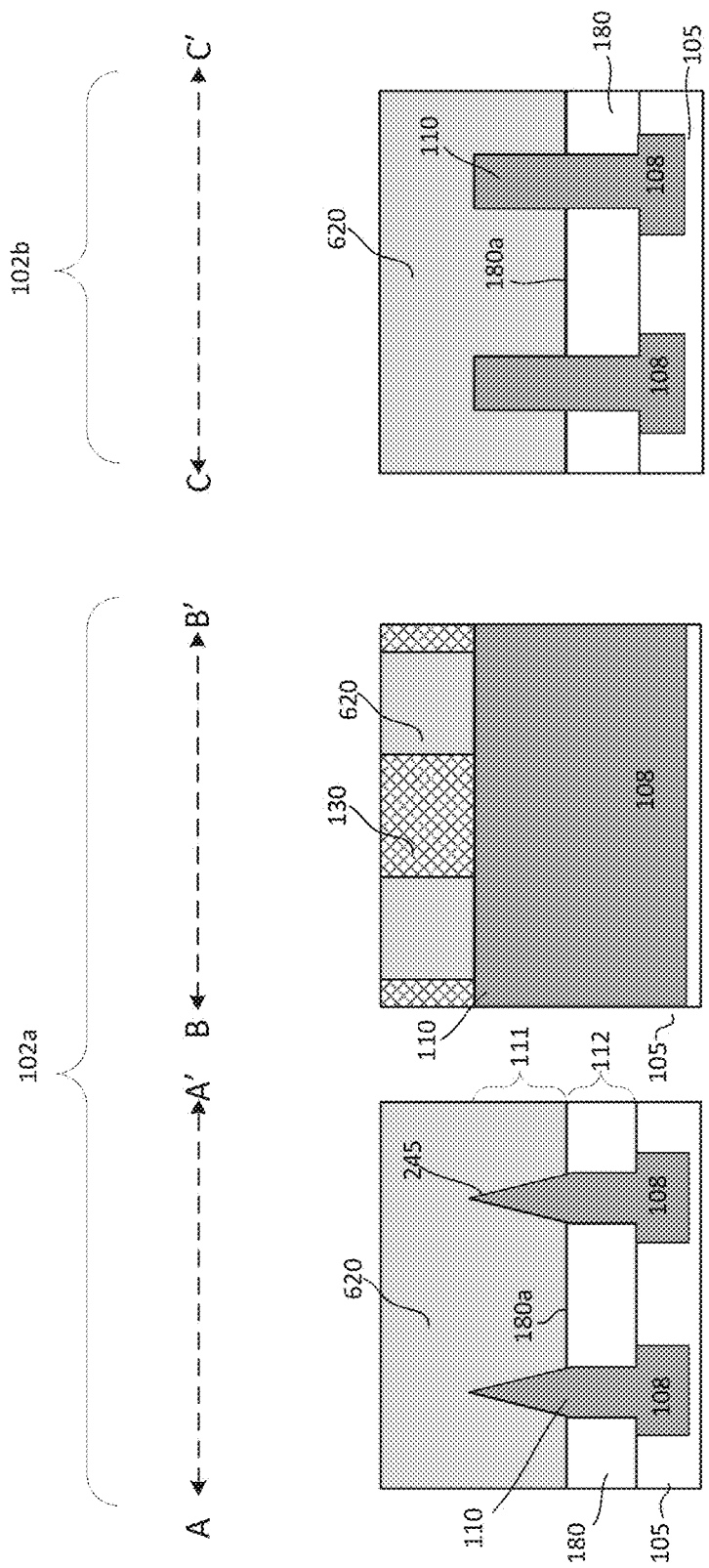

The process continues with FEOL logic processing. For example, the process continues to form sidewalls spacers (not shown) adjacent to sidewalls of the dummy gates and contact regions in portions of the fin structures not shielded by the dummy gates. The contact regions, for example, include one or more well tap regions in the first region and S/D regions in the second region. Materials and techniques for forming the sidewall spacers, well tap regions and S/D regions are the same as that described with respect to FIG. 6b above. A dielectric or a PMD layer 130 is formed on the substrate, covering the fin structures 110 and dummy gates 620 in the first and second regions 102a-102b. Material and technique for forming the PMD layer is the same as that described with respect to FIG. 6c above. The PMD layer 130 is planarized to remove excess dielectric or PMD layer, forming a planar top surface and a co-planar top surface with the dummy gates 620 in the first and second regions 102a-102b as shown in FIG. 7e.

After planarization, the exposed dummy gates in the first and second regions are selectively removed. Removal of the dummy gates may be achieved using technique as described with respect to FIG. 6d. Removal of the dummy gates form gate openings (not shown) which expose portion (e.g., channel region) of the fin structures in the first and second regions.

Figure 7F:
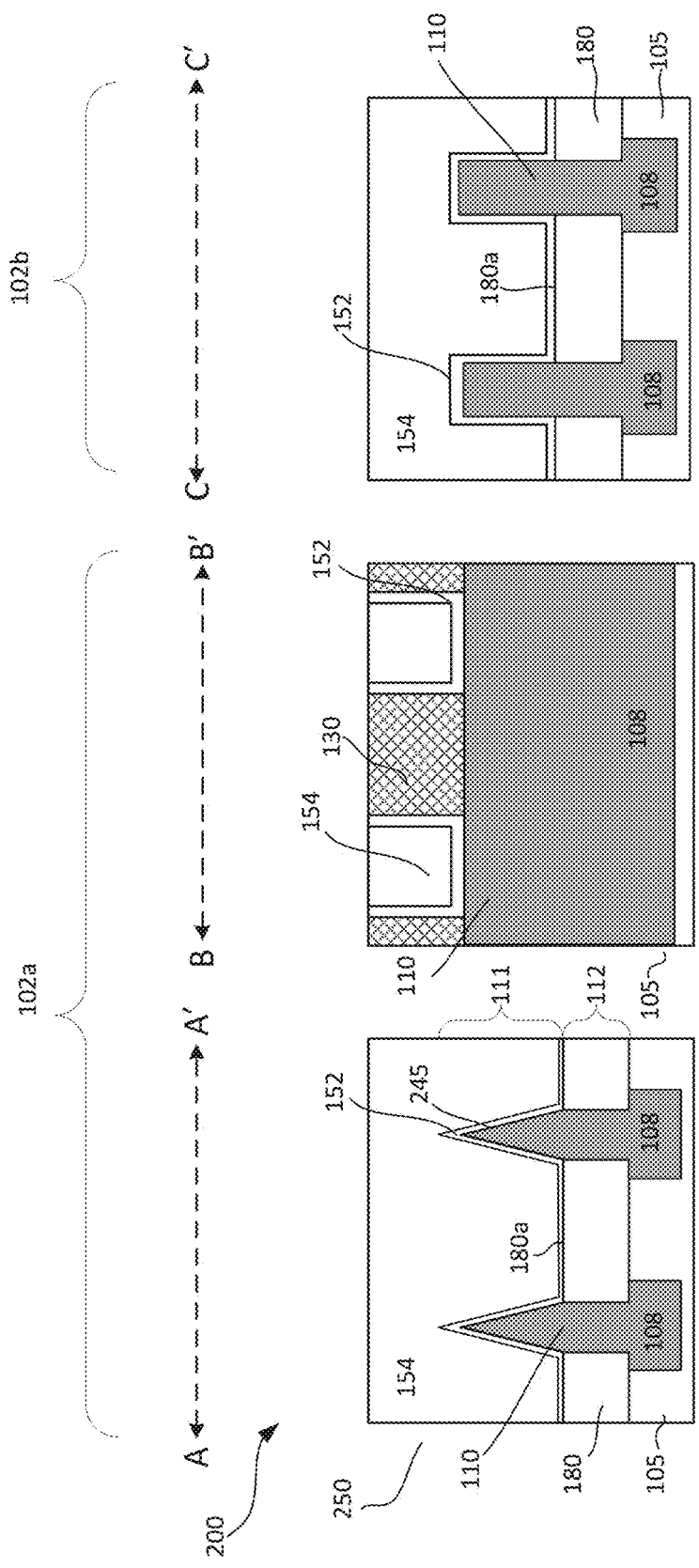

The process continues to form high-k metal gate stack layers on the substrate and in the gate openings in the first and second regions 102a-102b. The metal gate stack layers are planarized, forming a planar top surface between the PMD layer 130, gate dielectric 152 and metal gate electrode 154 as shown in FIG. 7f. Materials and techniques for forming the metal gates 250 are the same as that described with respect to FIG. 6h above. As shown, the interfacial and high-k gate dielectric layers 152 are disposed over the isolation layer 180 and wrap around the exposed top fin portion 111 of the fin structures 110 having the sharpened tip profile 245 in the first region 102a while the interfacial and high-k dielectric layers 152 are disposed over the isolation layer 180 and wrap around the exposed top fin portion 111 of the fin structures 110 having substantially planar surface profile or a gradient surface profile (not shown) in the second region 102b.

After forming the metal gate 250, the process continues to complete the formation of the device. For example, additional processes include forming via contacts or contact plugs to contact regions of the memory cells and logic transistors. Additional processes may include BEOL process to finish the manufacturing of the device, such as forming of one or more interconnect levels, final passivation, dicing, assembly, packaging and testing. Other processes are also useful.

FIGS. 8a-8f show another embodiment of a process 800 for forming a device 300. The process 800 is similar to the process 600 shown in FIGS. 6a-6h. The device 300 formed, for example, is the same as that shown and described in FIGS. 3a-3d. In the interest of brevity, the description below will focus primarily the difference(s) between these processes and common elements and processes may not be described or described in detail.

As shown in FIG. 8a, the substrate is processed at the same stage as that described in FIG. 6b. For example, the substrate 105 is processed to form fin structures 110 and doped wells 108 in the substrate below the fin structures in the first and second regions 102a-102b. Isolation layer 180 having thickness less than the height of the fin structures is also formed in the first and second regions to isolate the fin structures. Dummy gates 620 are defined and formed in the second (or logic) region 102b and sidewall spacers (not shown) are formed adjacent to the dummy gates.

Figure 8B:
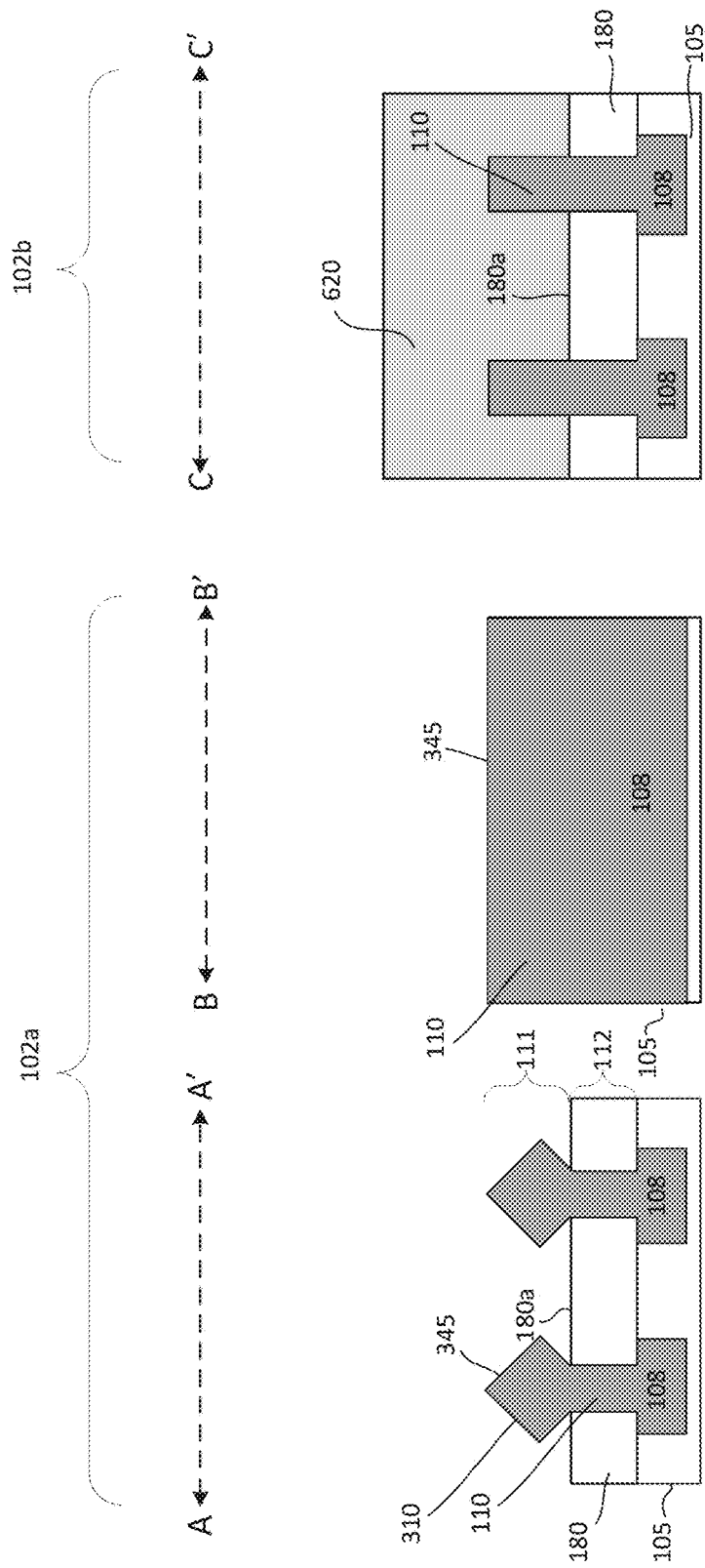

In one embodiment, the process continues by forming epitaxial layer over exposed top fin portion 111 of the fin structures 110 in the first and second regions 102a-102b. The epitaxial layers are formed by selective epitaxial growth (SEG) process to form raised or elevated top fin portion 310. The SEG selectively forms crystalline epitaxial layer on the entire exposed top fin portion of the fin structures in the first region 102a and forms crystalline epitaxial layers on exposed top fin portion of the fin structures not shielded by the dummy gate 620 in the second region 102b. As shown in FIG. 8b, the raised top fin portion 310 has a faceted cross-section profile, due to different growth rate at different crystallographic orientation of the surfaces of the fin. For example, the epitaxial layer grows much more rapidly along a first crystallographic orientation of the fin structure to form a sharpened tip profile 345 at the top of the fin structures 110 and much more slowly in other crystallographic orientation of the fin. Thus, by understanding the different growth rates of the epitaxial layer at different crystal orientations of the fin structure, the process parameters of the SEG process may be appropriately selected to form the desired sharpened tip profile at the top of the fin structures. As shown, the raised top fin portion with the sharpened tip profile is formed throughout the entire exposed top fin portion 111 of the fin structures 110 in the first region 102a while the raised top fin portion with sharpened tip profile (not shown) is formed on exposed top fin portion of the fin structures not covered by the dummy gates 620 in the second region 102b.

The height of the raised top fin portion having epitaxial layer with the faceted cross-section and a sharpened tip profile should be below the top surface of the dummy gate 620. The process may continue to form one or more well tap regions in the first region and S/D regions in the second region. An implant mask may be employed to form the well tap and S/D regions. Exposed raised top fin portion not covered by the implant mask, for example, are heavily doped with suitable polarity type dopants to form raised well tap and S/D regions. For example, raised top fin portion of the fin structures in the first region not shielded by the implant mask and raised top fin portion of the fin structures not shielded by the dummy gate in the second region are implanted with suitable polarity type dopants to form the heavily doped well tap and S/D regions. The well tap and S/D regions may be formed simultaneously if they include the same polarity type of dopants. Alternatively, the well tap and S/D regions may be formed in separate steps if they include dopants of opposite polarity types. The dopants may be incorporated into the raised portions by in-situ doping. Other suitable techniques for incorporating the dopants into the raised portions may also be useful.

Figure 8C:
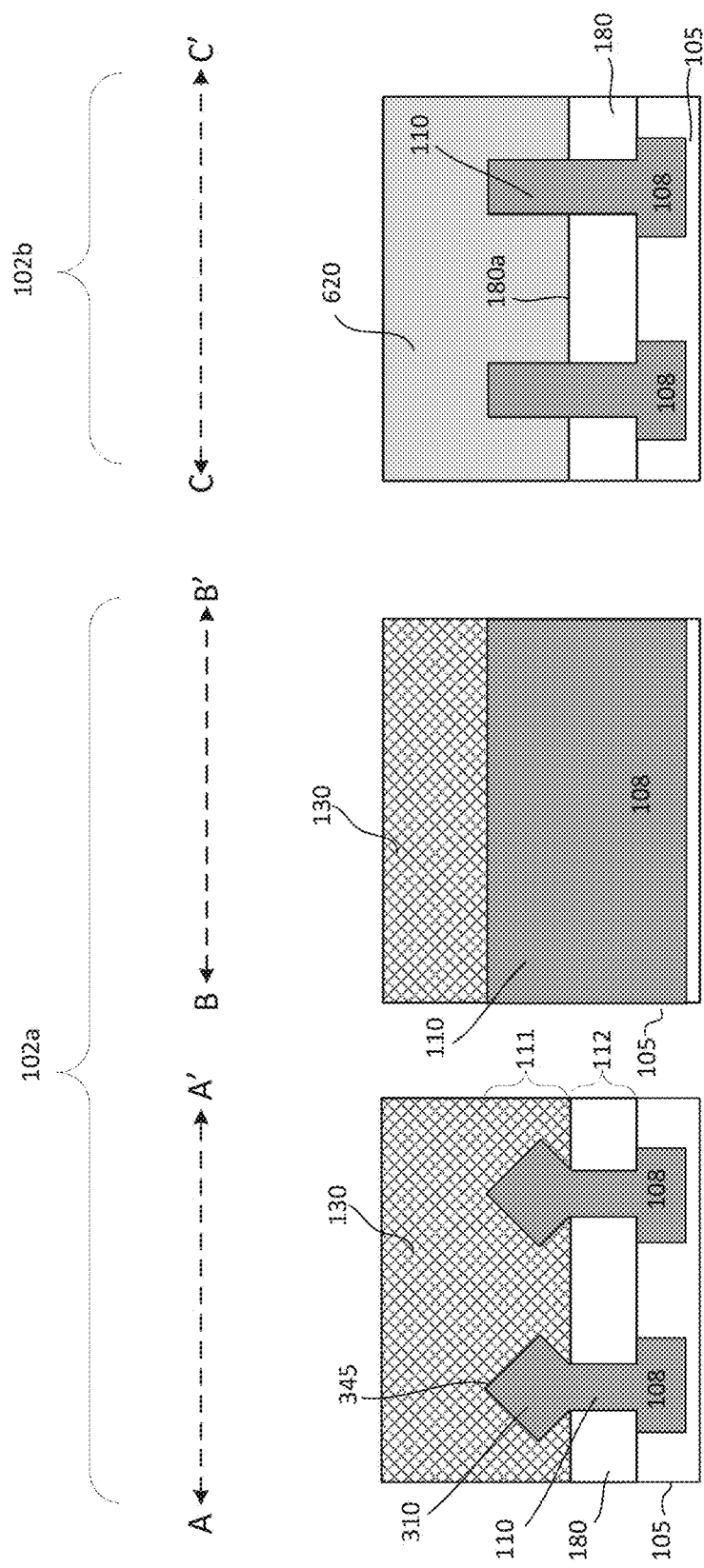

A dielectric liner (not shown) which serves as a contact etch stop layer and/or stress layer may be formed over the substrate covering the fin structures and the dummy gates. A PMD layer 130 is formed on the substrate, covering the fin structures and dummy gates in the first and second regions as shown in FIG. 8c. Material and technique for forming the PMD layer are the same as that described with respect to FIG. 6c above. The PMD layer 130 is planarized to remove excess PMD layer, forming a planar top surface and a co-planar top surface with the dummy gates 620 in the second region 102b as shown in FIG. 8c.

Figure 8D:
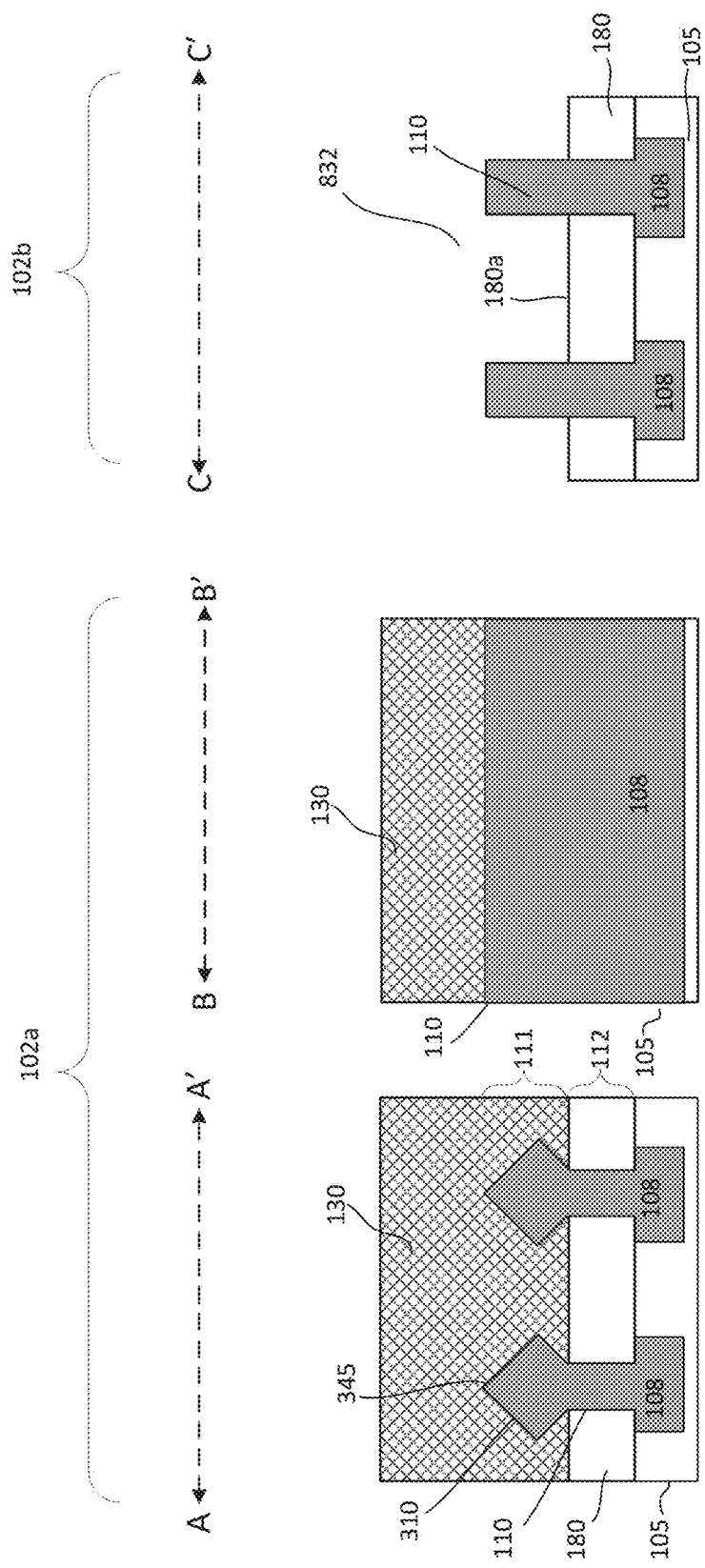

After planarization, the exposed dummy gates 620 in the second region 102b are selectively removed as shown in FIG. 8d. Removal of the dummy gates may be achieved using technique as described with respect to FIG. 6d. Removal of the dummy gates form gate openings 832 which expose portion (e.g., channel region) of the fin structures having substantially planar surface profile or a gradient surface profile (not shown) in the second regions.

Figure 8E:
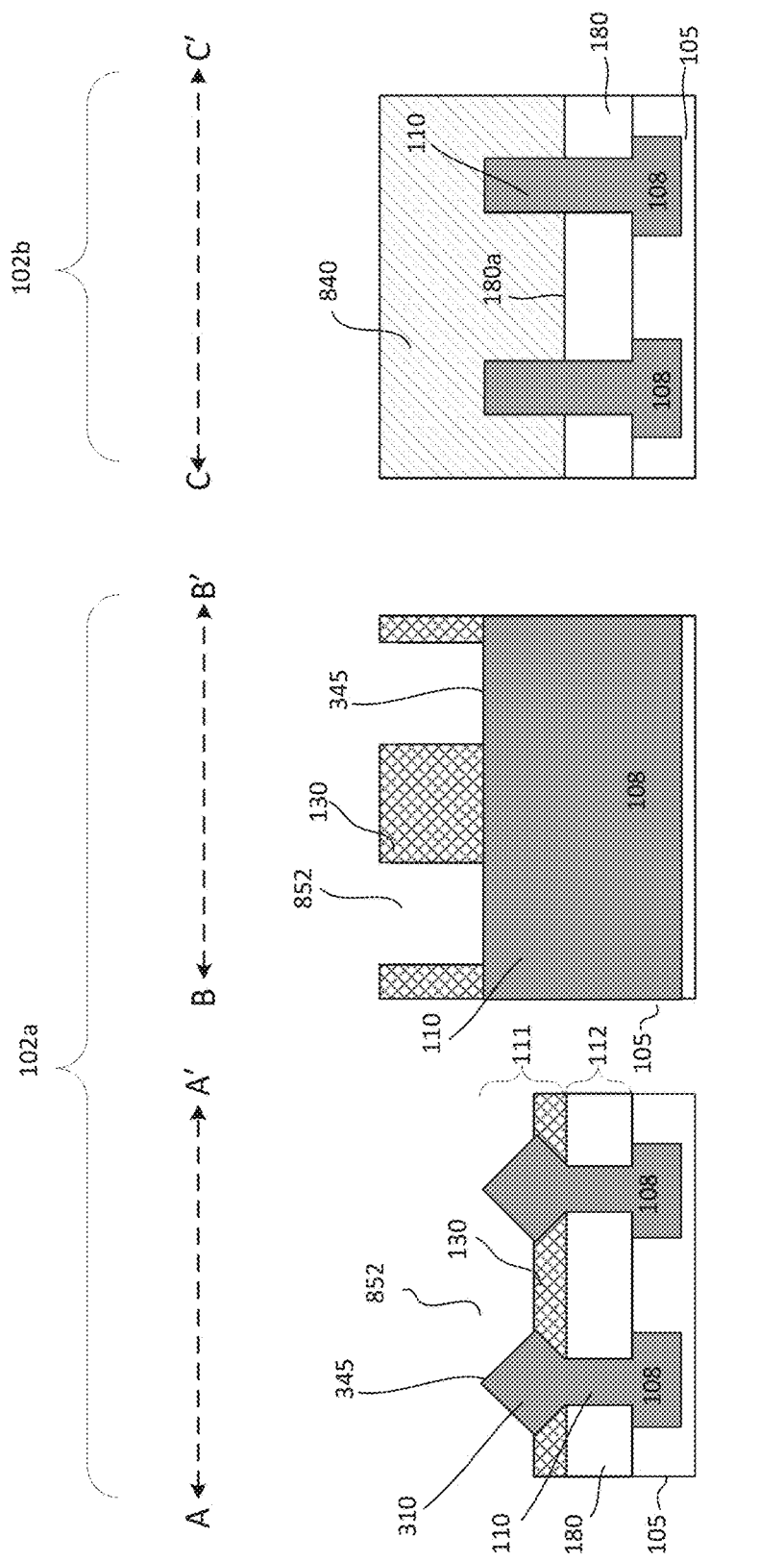

Referring to FIG. 8e, the process continues to form a protective mask 840 in the second region 102b similar to that described with respect to FIG. 6e. The protective mask, for example, includes photoresist material and fills the gate openings 832 in the second region. In one embodiment, the dielectric layer 130 is patterned to remove portions of the dielectric layer in the first region 102a. The patterning process, in one embodiment, reduces thickness of the PMD layer and form gate openings 852 corresponding to locations (e.g., channel region) where metal gates will be formed in the first region later. As shown in FIG. 8e, the patterning process exposes upper portion of the raised top fin portion with a faceted cross-section profile in the channel region of the fin structures in the first region while lower portion of the raised top fin portion are embedded in the remaining PMD layer 130. Thus, the upper portion of the raised top fin portion has a sharpened tip profile 345 which is protruded over the PMD layer in the first region 102a. The tip over the raised top fin portion of the fin structures in the first region is sufficiently sharp to enable a later formed interfacial layer of a gate dielectric to breakdown easily during programming. As for the second region 102b, the protective mask 840 protects and covers the fin structures having substantially planar surface profile in the second region as shown in FIG. 8e or a gradient surface profile (not shown).

Figure 8F:
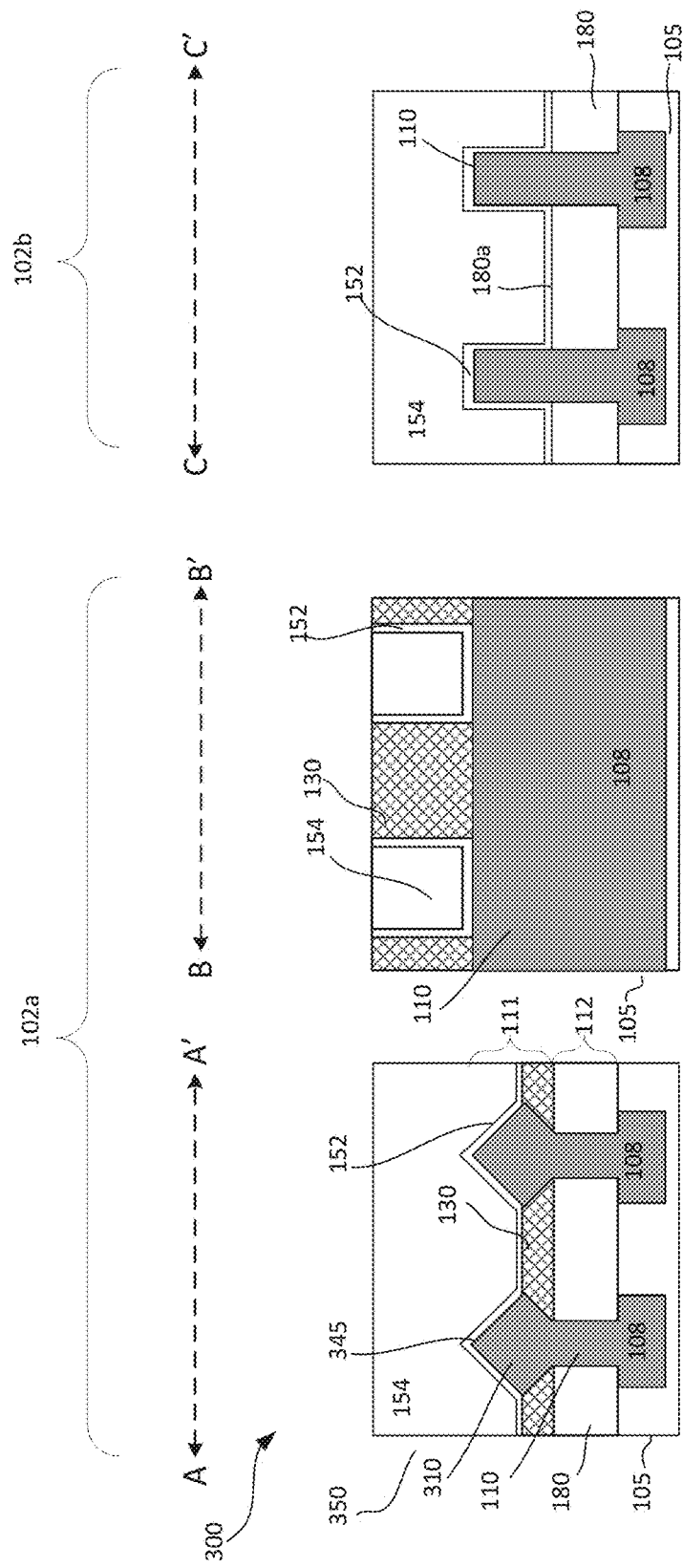

The protective mask 840 is removed using suitable technique after patterning the PMD layer 130. The process continues to form high-k metal gate stack layers on the substrate and in the gate openings 852 and 832 in the first and second regions. The metal gate stack layers are planarized, forming a planar top surface between the PMD layer 130, gate dielectric 152 and metal gate electrode 154 as shown in FIG. 8f. Materials and techniques for forming the metal gates 350 are the same as that described with respect to FIG. 6h above. As shown, the interfacial and high-k gate dielectric layers 152 are disposed over the PMD layer and wrap around the exposed top of the fin structures having the sharpened tip profile 345 in the first region 102a while the interfacial and high-k dielectric layers 152 are disposed over the isolation layer 180 and wrap around the exposed top of the fin structures having substantially planar surface profile or a gradient surface profile (not shown) in the second region.

After forming the metal gate 350, the process continues to complete the formation of the device. For example, additional processes include forming via contacts or contact plugs to contact regions of the memory cells and logic transistors, BEOL process to finish the manufacturing of the device, such as forming of one or more interconnect levels, final passivation, dicing, assembly, packaging and testing. Other processes are also useful.

FIGS. 9a-9e show another embodiment of a process 900 for forming a device 400. The process 900 is similar to the process 600 and 800 shown in FIGS. 6a-6h and FIGS. 8a-8f. The device 400 formed, for example, is the same as that shown and described in FIGS. 4a-4d. In the interest of brevity, the description below will focus primarily the difference(s) between these processes and common elements and processes may not be described or described in detail.

Figure 9A:
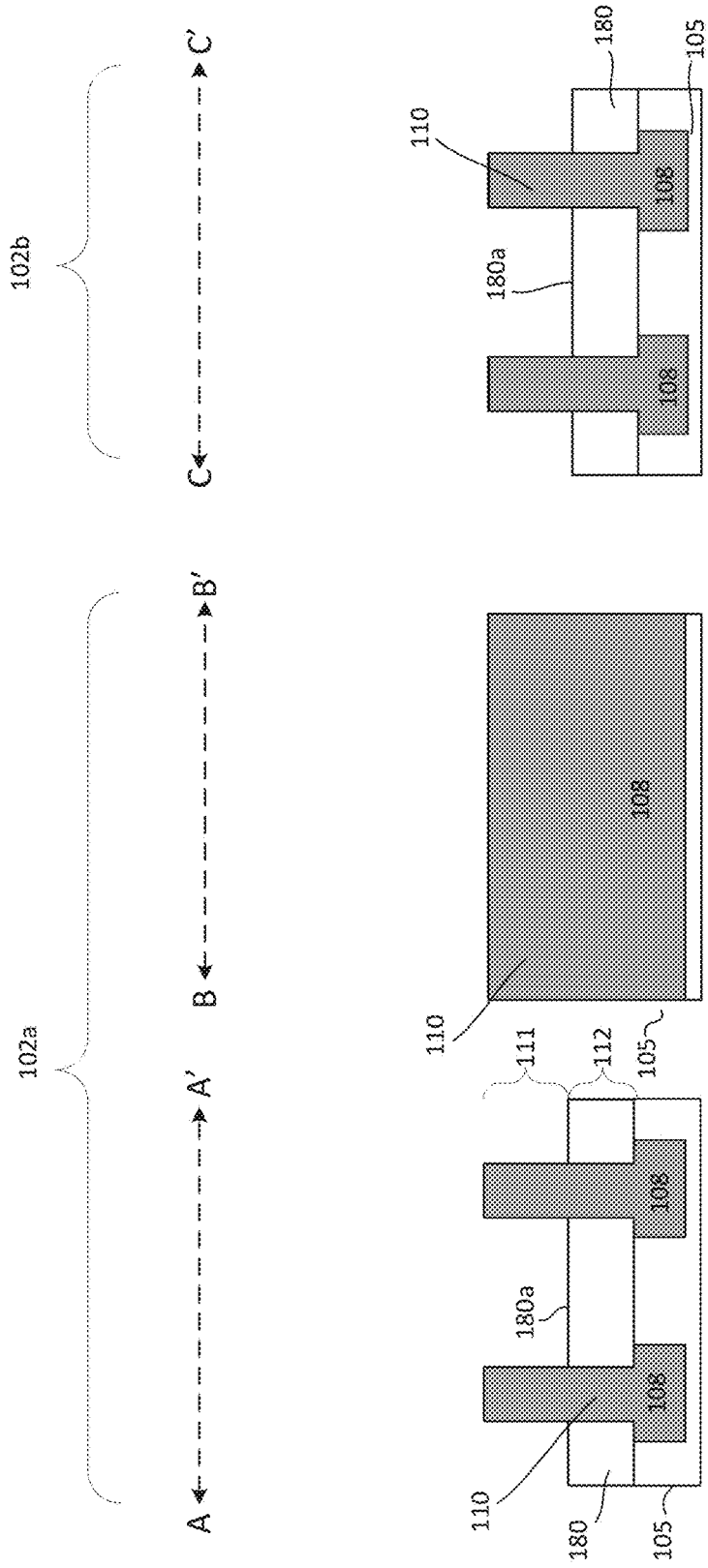
FIGS. 9a-9e show cross-sectional views of yet another embodiment of a process for forming a device.

As shown in FIG. 9a, the substrate is processed at the same stage as that described in FIG. 6a. For example, the substrate is processed to form fin structures 110 and doped wells 108 in the substrate below the fin structures in the first and second regions 102a-102b. Isolation layer 180 having thickness less than the height of the fin structures is also formed in the first and second regions to isolate the fin structures.

Figure 9B:
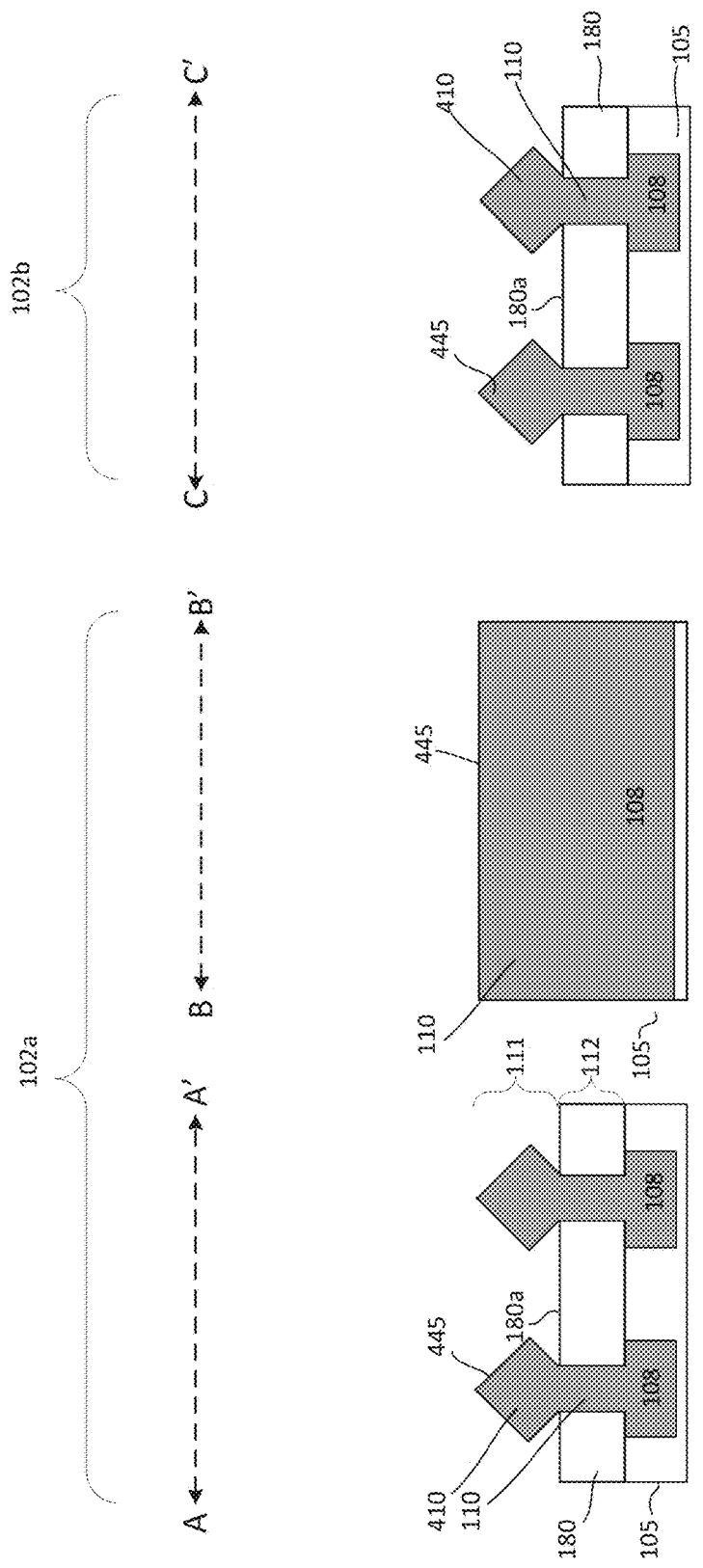

In one embodiment, the process continues by forming epitaxial layer over exposed top fin portion 111 of the fin structures 110 in the first and second regions 102a-102b. The epitaxial layer is formed by SEG process as described with respect to FIG. 8b. In one embodiment, the SEG selectively forms crystalline epitaxial layer on the entire exposed top fin portion 111 of the fin structures 110 to form raised top fin portion 410 in the first and second regions 102a-102b. As shown in FIG. 9b, the raised top fin portion 410 has a faceted cross-section profile, due to different growth rate at different crystallographic orientation of the surfaces of the fin. As shown, the raised top fin portion with epitaxial layer having a sharpened tip profile 445 is formed throughout the entire exposed top fin portion (e.g., including channel and non-channel regions) of the fin structures in the first and second regions 102a-102b.

Figure 9C:
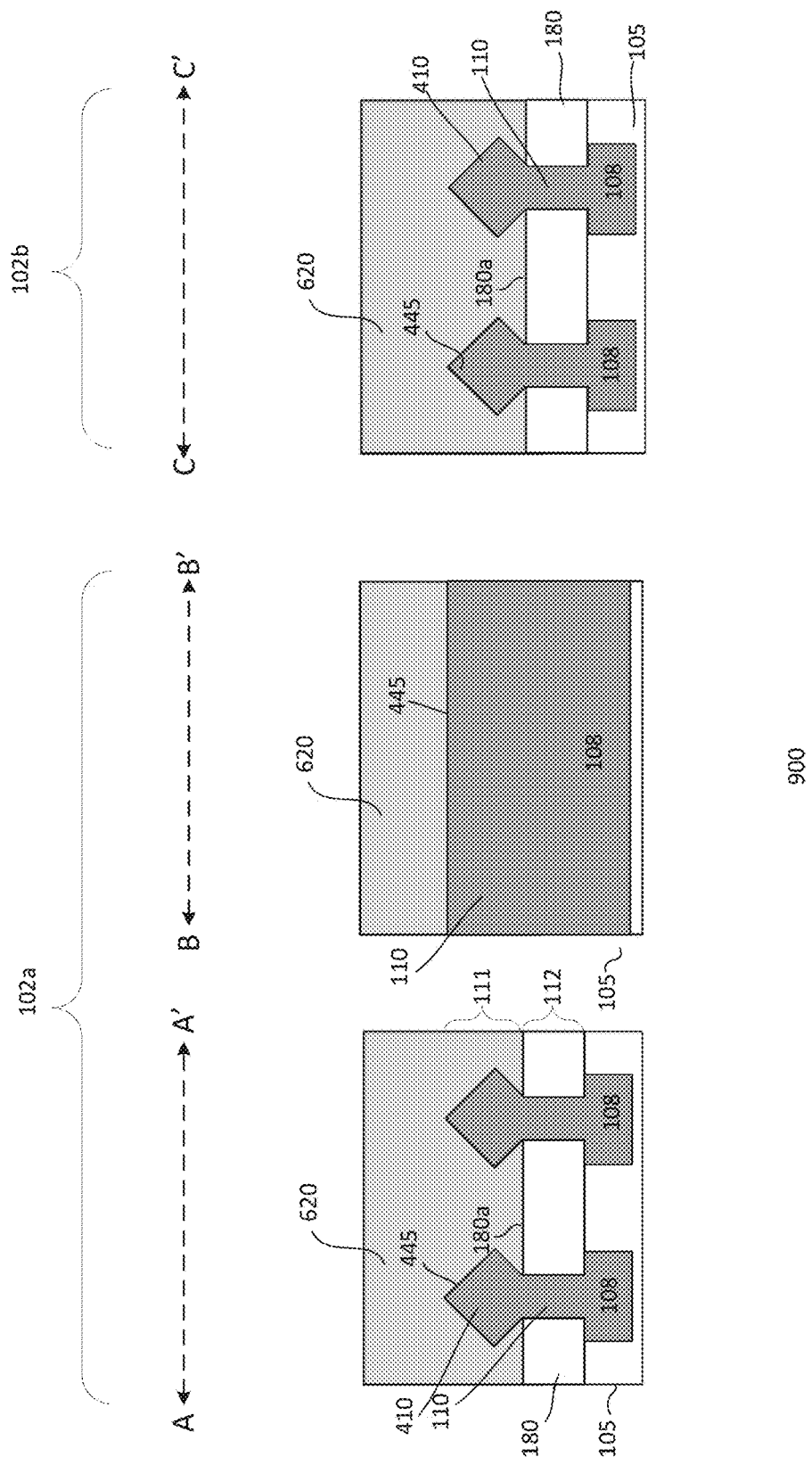

Referring to FIG. 9c, the process continues to form dummy gates 620. For example, a dummy gate dielectric layer and a dummy gate electrode layer are conformally formed over the isolation layer in the first and second regions 102a-102b and cover the fin structures with raised top fin portion 410 as shown in FIG. 9c. Materials and techniques for forming the dummy gate layers are the same as that described with respect to FIG. 6b above. In one embodiment, the dummy gate layers are patterned using suitable mask and etch techniques to form patterned gates which serve as dummy gates 620 in the first and second regions. The dummy gates, for example, traverse and wrap around the raised portions having faceted cross-section profile in the channel region of the fin structures in the first and second regions.

Figure 9D:
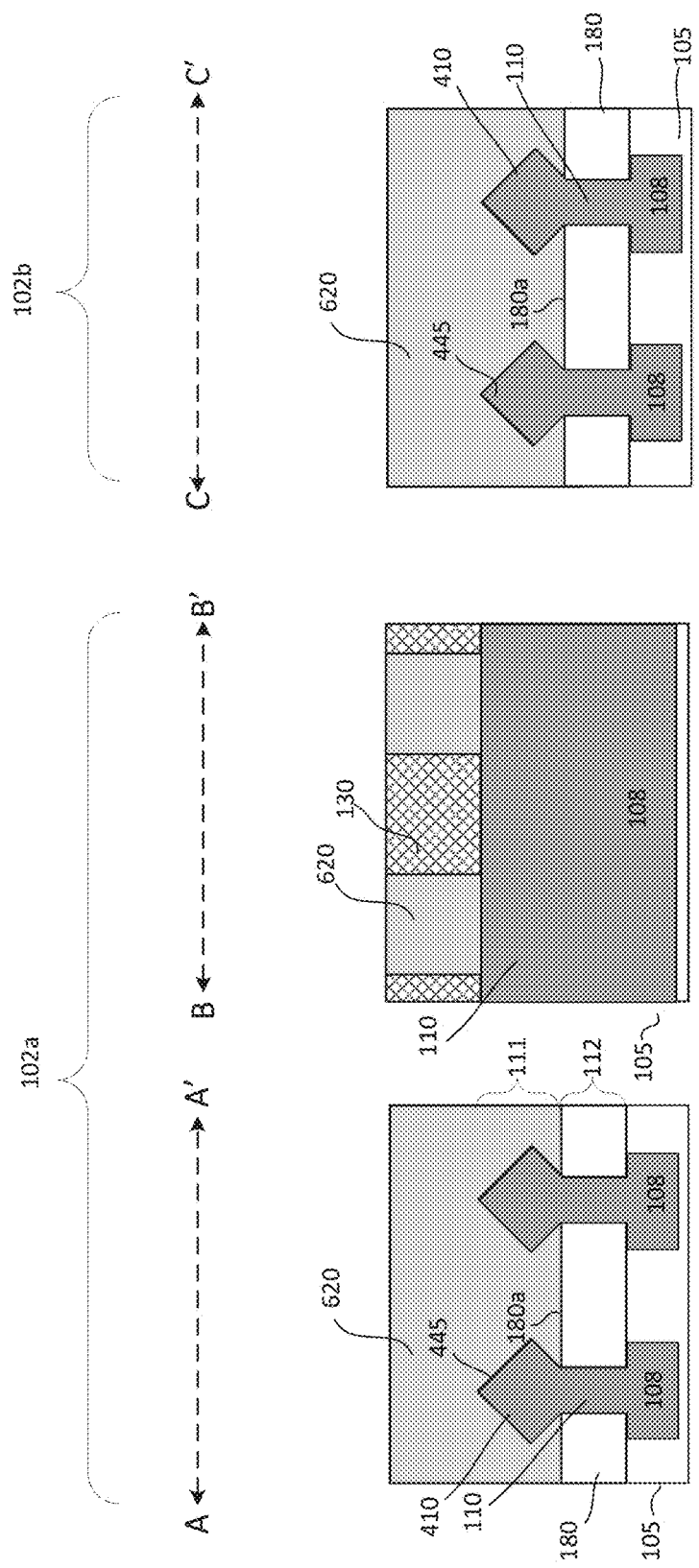

The process continues with FEOL logic processing. For example, the process continues to form sidewalls spacers (not shown) adjacent to sidewalls of the dummy gates 620 and contact regions in exposed raised top fin portions of the fin structures not shielded by the dummy gates. For example, the contact regions include one or more well tap regions in the first region and S/D regions in the second region. Materials and techniques for forming the sidewall spacers and heavily doped raised well tap and S/D regions are the same as that described with respect to FIG. 8b above. A PMD layer 130 is formed on the substrate, covering the raised top fin portions and dummy gates in the first and second regions. Material and technique for forming the PMD layer is the same as that described with respect to FIG. 6c above. The PMD layer is planarized to remove excess dielectric or PMD layer, forming a planar top surface and a co-planar top surface with the dummy gates 620 in the first and second regions as shown in FIG. 9d.

After planarization, the exposed dummy gates in the first and second regions are selectively removed. Removal of the dummy gates may be achieved using technique as described with respect to FIG. 6d. Removal of the dummy gates form gate openings which expose portion of the raised portion (e.g., channel region) of the fin structures in the first and second regions.

Figure 9E:
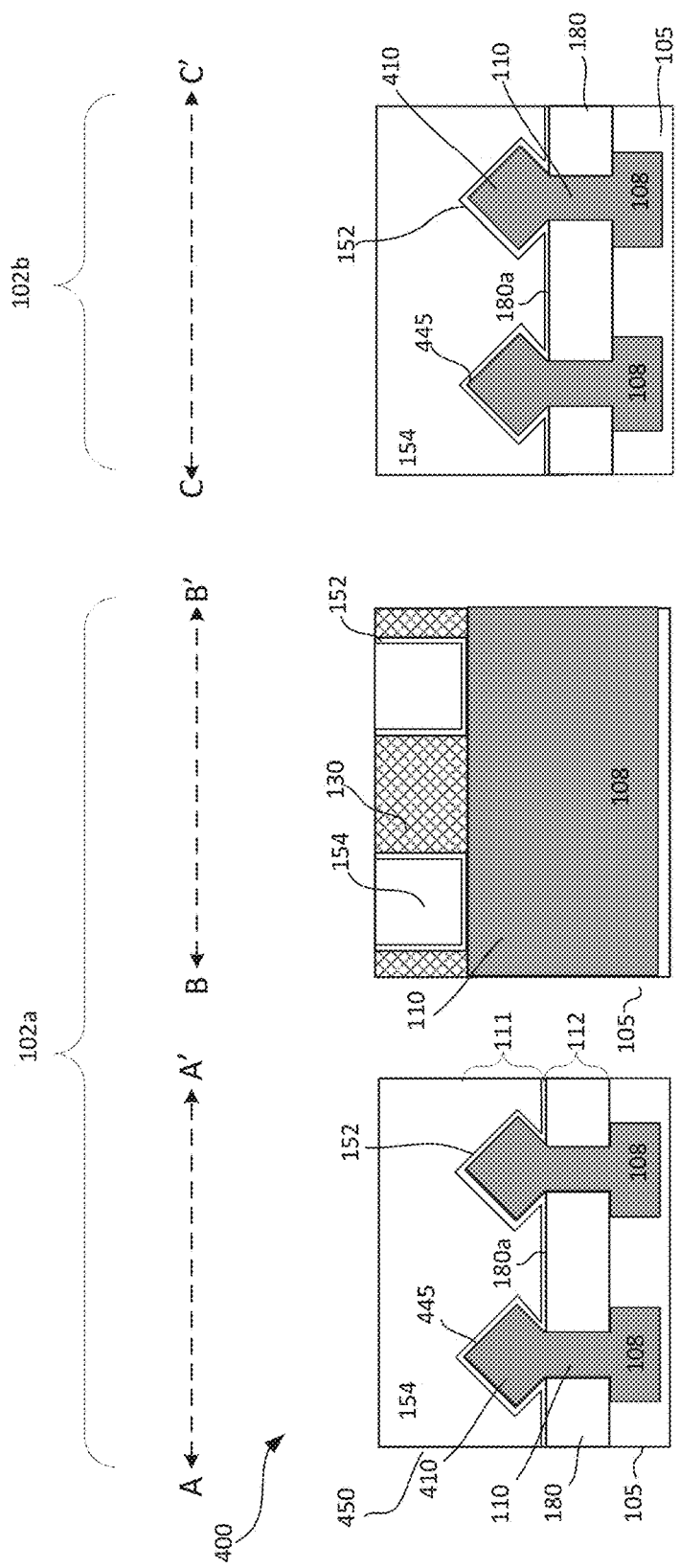

The process continues to form high-k metal gate stack layers on the substrate and in the gate openings in the first and second regions. The metal gate stack layers are planarized, forming a planar top surface between the PMD layer 130, gate dielectric 152 and metal gate electrode 154 as shown in FIG. 9e. Materials and techniques for forming the metal gates 450 are the same as that described with respect to FIG. 6h above. As shown, the interfacial and high-k gate dielectric layers 152 are disposed over the isolation layer 180 and wrap around the exposed top portion of the fin structures with raised portion having a sharpened tip profile in the first and second regions as shown in FIG. 9e.

After forming the metal gate 450, the process continues to complete the formation of the device. For example, additional processes include forming via contacts or contact plugs to contact regions of the memory cells and logic transistors, BEOL process to finish the manufacturing of the device, such as forming of one or more interconnect levels, final passivation, dicing, assembly, packaging and testing. Other processes are also useful.

Figure 10A:
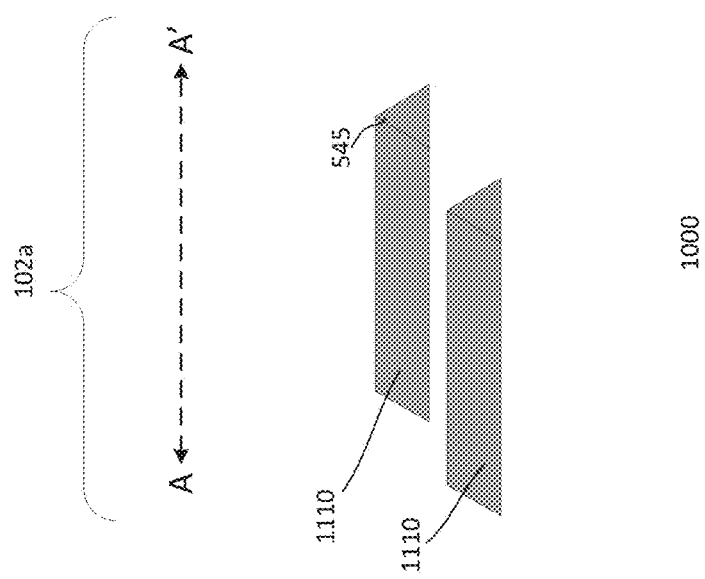
FIGS. 10a-10b show another embodiment of a process for forming a device.
Figure 10B:
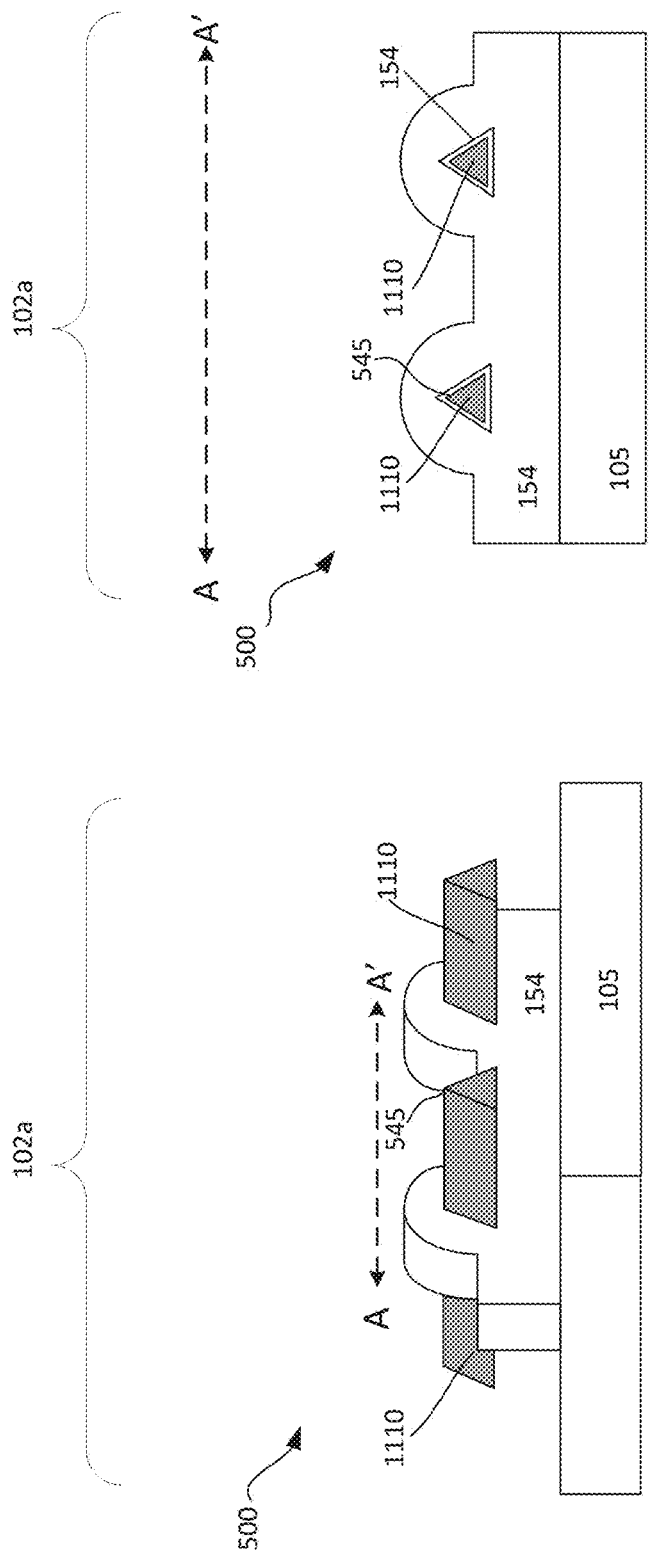

FIGS. 10a-10b show another embodiment of a process 1000 for forming a device 500. The process 1000 is similar to the process 600 shown in FIGS. 6a-6h. The device 500 formed, for example, is the same as that shown and described in FIGS. 5a-5c. In the interest of brevity, the description below will focus primarily the difference(s) between these processes and common elements and processes may not be described or described in detail.

FIG. 10a shows a simplified 3-D view of a portion of a device. For simplicity and illustration purpose, only the nanowire portions of the first (or memory) region 102a is shown while substrate portions which hold the nanowires in the first region and the second region 102b with logic transistors are omitted. In one embodiment, the nanowires 1110 include a sharpened tip 545 at top of the nanowires as shown in FIG. 10a. The nanowires are in-situ doped with, for example, n-type dopants, and configured to serve as bitlines of the OTP anti-fuse based memory cell.

By way of example, the nanowires may be formed using a top-down approach. For example, a combination of suitable etch and oxidation processes may be utilized to process the fin structures as shown in FIG. 6g above to form the nanowires with the desired tip profile 545 which is sufficiently sharp to enable a later formed interfacial layer of a gate dielectric to breakdown easily during programming as shown in FIG. 10a. The nanowire with the desired sharpened tip profile can be formed using suitable etch process with suitable etch chemistries to reduce the width of the fin structure and to create slanted fin sidewalls and performing suitable oxidation process to grow an oxide layer on the fin sidewalls to suspend the nanowires. In one embodiment, the etch and oxidation processes are highly selective to a first crystallographic plane of the fin structure relative to a second crystallographic plane of the fin structure. For example, the etch and oxidation processes may be tailored such that material of the fin structure is consumed much more rapidly along a first crystallographic direction at the top surface of the fin structure to form a sharpened tip profile at the top of the fin structure and consumes much more slowly in other crystallographic directions at sidewalls of the fin structure. A stripping process using suitable chemistry is conducted thereafter to remove the oxide layer and suspend the nanowires from the substrate (not shown). The nanowires with the desired sharpened tip profile at the top of the nanowires are formed in the first and second regions.

Although a top-down approach is illustrated, it is understood that the nanowires with the desired tip profile may be formed using various suitable techniques, including a bottom-up approach. For example, a combination of suitable epitaxial growth, deposition and annealing processes may be utilized to process the fin structures as shown in FIG. 6a above to form the nanowires with the desired tip profile 545 as shown in FIG. 10a. For illustration purpose, the nanowires are formed by processing fin structures as described above. However, it is understood that nanowires with the desired tip profile may be formed using other suitable techniques, which include techniques without processing fin structures.

The process continues to form high-k metal gate stack layers on the substrate in the first and second regions. Forming the metal gate stack layers includes forming a gate dielectric layer and a metal gate electrode layer on the substrate in the first and second regions. The gate dielectric layer, in one embodiment, includes an interfacial and a high-k gate dielectric stack 152. The interfacial and high-k gate dielectric stack layers 152, in one embodiment, wraps around the nanowires 1110 and are formed by ALD. The interfacial and high-k gate dielectric layers include materials which are the same as that described in FIG. 6h above. As shown, the interfacial and high-k gate dielectric layers 152 wrap around the nanowires having the desired tip profile 545 at top of the nanowires. A metal gate electrode layer 154, such as TaN or TiN, may be formed over the dielectric layers and the substrate by ALD, CVD or physical vapor deposition (PVD). Other types of gate dielectric materials, electrode materials or forming techniques may also be useful. The high-k metal gate stack layers are patterned to form a patterned metal gate electrode 550 in the first region 102a. For example, suitable mask and etch techniques may be employed to remove exposed portions of the high-k metal gate stack layers from the first region. The metal gate 550, for example, wraps around and traverses the nanowires in the first region as shown in FIG. 10b.

After forming the metal gate 550, the process continues to complete the formation of the device. For example, additional processes include forming via contacts or contact plugs to contact regions of the memory cells and logic transistors, BEOL process to finish the manufacturing of the device, such as forming of one or more interconnect levels, final passivation, dicing, assembly, packaging and testing. Other processes are also useful.

The embodiments as described in FIGS. 6a-6h, FIGS. 7a-7f, FIGS. 8a-8f, FIGS. 9a-9e and FIGS. 10a-10b include similar or the same advantages as described with respect to FIGS. 1a-1d, FIGS. 2a-2d, FIGS. 3a-3d, FIGS. 4a-4d and FIGS. 5a-5c above. Moreover, the processes as described in this disclosure enable the desired tip profile which is sufficiently sharp to enable a later formed interfacial layer of a gate dielectric to breakdown easily during programming to be achieved at top of the fin structures or nanowires, allowing low power embedded anti-fuse based OTP structures to be formed. Furthermore, the processes as described allow the anti-fuse based OTP cell to be formed together or simultaneously with the logic transistors on the same substrate. Some of these processes do not require additional mask for embedding the anti-fuse based OTP structure with logic device. Thus, the processes as described are simplified and are more cost effective relative to conventional processes. Additionally, the processes to embed the OTP cell are highly compatible and easily integrated with logic processing.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
  a semiconductor substrate;
  an isolation layer disposed on the substrate;
  a memory region defined on the substrate, the memory region including a one-time programmable memory cell, and the one-time programmable memory cell comprises comprising:
    a first semiconductor fin disposed on the semiconductor substrate, the first semiconductor fin having a lower portion surrounded by the isolation layer and an upper portion protruding above the isolation layer, and the upper portion of the first semiconductor fin having a sharpened tip profile, and
    a first gate disposed on the isolation layer and extending laterally to traverse the first semiconductor fin, the first gate including a gate electrode layer and a gate dielectric layer that are arranged in part over the sharpened tip profile of the upper portion of the first semiconductor fin; and
  a logic region defined on the substrate, the logic region including a logic transistor, and the logic transistor comprising:
    a second semiconductor fin disposed on the substrate, the second semiconductor fin including a lower portion surrounded by the isolation layer and an upper portion protruding above the isolation layer, and the upper portion of the second semiconductor fin having a rectangular-shaped cross-section with a substantially planar top surface, and
    logic a second gate disposed on the isolation layer and extending laterally to traverse the second semiconductor fin, and the second gate including a second gate electrode layer and a gate dielectric layer that are arranged in part over the planar top surface of the upper portion of the second semiconductor fin, and
    wherein the first gate dielectric layer over the sharpened tip profile of the upper portion of the first semiconductor fin has a breakdown voltage that is less than a breakdown voltage of the second gate dielectric layer over the substantially planar top surface of the second semiconductor fin.

2. The device of claim 1 wherein the first semiconductor fin has a first sidewall and a second sidewall, and the sharpened tip profile does not extend beyond the first sidewall or the second sidewall.

3. The device of claim 1 wherein the gate dielectric layer of the first gate wraps around a channel region of the first semiconductor fin and covers the sharpened tip profile of the top portion of the first semiconductor fin.

4. The device of claim 3 wherein the first gate has a first side and a second side, non-channel regions of the first semiconductor fin are respectively arranged adjacent to the first side and the second side of the first gate, and the channel region includes a first source/drain region and a second n-type source/drain region.

5. The device of claim 1 wherein the top portion of the first semiconductor fin includes an epitaxial layer having a faceted cross-section profile that defines the sharpened tip profile.

6. The device of claim 5 wherein the first semiconductor fin includes a channel region and non-channel regions, and the faceted cross-section profile of the epitaxial layer traverses the channel region and the non-channel regions of the first semiconductor fin.

7. The device of claim 1 wherein the second gate includes a first side and a second side, the second semiconductor fin includes non-channel regions of the logic fin member adjacent to the first side and the second side of the second gate and a channel region, and the non-channel regions include a first n-type source/drain region and a second n-type source/drain region.

8. The device of claim 1 wherein the isolation layer surrounds a lower portion of the second semiconductor fin member in the logic device region, wherein the exposed upper portion of the logic fin member protrudes upwardly beyond a top surface of the isolation layer.

9. The device of claim 1 wherein the gate electrode layer of the first gate and the gate electrode layer of the second gate are sections of a first shared layer, and the gate dielectric layer of the first gate and the gate dielectric layer of the second gate are sections of a second shared layer.

* * * * *

UNITED STATES PATENT AND TRADEMARK OFFICE
CERTIFICATE OF CORRECTION

PATENT NO. : 10,381,356 B2
APPLICATION NO. : 15/674558
DATED : August 13, 2019
INVENTOR(S) : Ping Zheng et al.

Page 1 of 1

It is certified that error appears in the above-identified patent and that said Letters Patent is hereby corrected as shown below:

In the Claims
Column 21, Claim 1, Line 40, before "comprising" delete "comprises"
Column 22, Claim 1, Line 5, before "a" delete "logic"

Signed and Sealed this
Twenty-fourth Day of September, 2019

Andrei Iancu
*Director of the United States Patent and Trademark Office*